(12) United States Patent
Zhang et al.

(10) Patent No.: US 10,461,186 B1
(45) Date of Patent: Oct. 29, 2019

(54) METHODS OF FORMING VERTICAL FIELD EFFECT TRANSISTORS WITH SELF-ALIGNED CONTACTS AND THE RESULTING STRUCTURES

(71) Applicant: GLOBALFOUNDRIES INC., Grand Cayman (KY)

(72) Inventors: John H. Zhang, Altamont, NY (US); Ruilong Xie, Schenectady, NY (US); Mahender Kumar, San Jose, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/994,392

(22) Filed: May 31, 2018

(51) Int. Cl.
| | |
|---|---|
| H01L 29/78 | (2006.01) |
| H01L 29/66 | (2006.01) |
| H01L 21/762 | (2006.01) |
| H01L 29/06 | (2006.01) |

(52) U.S. Cl.
CPC ........ *H01L 29/7827* (2013.01); *H01L 21/762* (2013.01); *H01L 29/0649* (2013.01); *H01L 29/66575* (2013.01); *H01L 29/66666* (2013.01)

(58) Field of Classification Search
CPC ........... H01L 29/7827; H01L 29/66666; H01L 29/785; H01L 29/66795; H01L 29/78642; H01L 21/823885; H01L 21/76895; H01L 23/535; H01L 27/1203
See application file for complete search history.

(56) References Cited

U.S. PATENT DOCUMENTS

| | | | |
|---|---|---|---|
| 6,855,610 B2 | 2/2005 | Tung et al. | |
| 6,884,715 B1 | 4/2005 | Kwon et al. | |
| 9,530,866 B1 * | 12/2016 | Zhang | H01L 29/66666 |
| 9,711,618 B1 * | 7/2017 | Cheng | H01L 29/66545 |
| 9,761,491 B1 | 9/2017 | Huang et al. | |
| 9,882,025 B1 | 1/2018 | Zhang | |
| 10,014,370 B1 * | 7/2018 | Xie | H01L 29/7827 |
| 10,236,215 B1 * | 3/2019 | Xie | H01L 29/41791 |
| 2003/0119237 A1 * | 6/2003 | Chittipeddi | H01L 21/823885 |
| | | | 438/199 |
| 2005/0127453 A1 | 6/2005 | Tung et al. | |
| 2011/0253981 A1 * | 10/2011 | Rooyackers | B82Y 10/00 |
| | | | 257/24 |
| 2018/0138046 A1 | 5/2018 | Bentley et al. | |
| 2019/0051757 A1 * | 2/2019 | Bourjot | H01L 29/78618 |

* cited by examiner

*Primary Examiner* — Zandra V Smith
*Assistant Examiner* — John M Parker
(74) *Attorney, Agent, or Firm* — Gibb & Riley, LLC; Anthony J. Canale

(57) ABSTRACT

Disclosed are methods wherein vertical field effect transistor(s) (VFET(s)) and isolation region(s) are formed on a substrate. Each VFET includes a fin extending vertically between source/drain regions, a spacer layer and a gate around the fin, and a source/drain sidewall spacer around an upper source/drain region. Optionally, a gate sidewall spacer is adjacent to the gate at a first end of the VFET. An isolation region is adjacent to the gate at a second end and opposing sides of the VFET and extends into the substrate. Contacts are formed including a lower source/drain contact (which is adjacent to the first end of the VFET and is self-aligned if the optional gate sidewall spacer is present) and a self-aligned gate contact (which extends into the isolation region at the second end of the VFET and contacts a side surface of the gate). Also disclosed are structures formed according to the methods.

20 Claims, 27 Drawing Sheets

METHODS OF FORMING VERTICAL FIELD EFFECT TRANSISTORS WITH SELF-ALIGNED CONTACTS AND THE RESULTING STRUCTURES

BACKGROUND

Field of the Invention

The present invention relates to vertical field effect transistors (VFETs) and, more particularly, to methods of forming VFETs with self-aligned contacts and the resulting structures.

Description of Related Art

Integrated circuit (IC) design decisions are often driven by device scalability, device density, manufacturing efficiency and costs. As the device density (i.e., the number of devices per unit area) of IC designs continues to be increased, forming vertical field effect transistors (VFETs) without violating design rules and/or risking the formation of defects (e.g., gate contact-to-upper source/drain region shorts, lower source/drain contact-to-gate shorts, etc.) can be difficult. For example, recently IC designs have been developed with a reduced fin pitch of 36 nm or less in order to increase device density in an array of VFETs. This reduction in fin pitch necessarily requires a corresponding reduction in the gate pitch to minimize parasitic capacitance. One recently developed technique for reducing gate pitch is the formation of a self-aligned gate (i.e., a gate where the shape of the gate is define during an etch process that uses a sidewall spacer formed on the gate stack as a mask). However, forming a gate contact to such a gate is problematic and typically requires the formation of a gate extension in order to provide a landing surface for the gate contact. Unfortunately, the added gate extension consumes additional chip area and, thus, cancels out any scaling benefit that could be achieved by reducing the fin pitch and the gate pitch.

SUMMARY

In view of the foregoing, disclosed herein are embodiments of a method of forming a semiconductor structure that includes one or more vertical field effect transistors (VFETs) and one or more self-aligned contacts including a self-aligned gate contact and, optionally, a self-aligned lower source/drain contact. Also disclosed herein are the resulting semiconductor structures.

More particularly, one embodiment of a method disclosed herein includes forming, on a substrate, a vertical field effect transistor (VFET), an isolation region and an additional isolation region. The VFET can have a first end, a second end opposite the first end and opposing sides and can be formed so that it includes, but is not limited to: a semiconductor fin that extends vertically between a lower source/drain region in the substrate and an upper source/drain region; a cap layer on the upper source/drain region; a spacer layer on the lower source/drain region and laterally surrounding the semiconductor fin; a gate on the spacer layer and laterally surrounding the semiconductor fin; and a source/drain sidewall spacer on the gate and laterally surrounding the upper source/drain region and the cap layer. The isolation region can be formed so that it extends from within the substrate upward through the spacer layer and is further positioned laterally adjacent to the second end and opposing sides of the VFET. The additional isolation region can be formed so that it is on the spacer layer and positioned laterally adjacent to the first end of the VFET.

The method can further include forming a dielectric layer on the VFET and further extending over the isolation region and the additional isolation region. After the dielectric layer is formed, contacts to the various VFET terminals can be formed. These contacts can include, but are not limited to, a self-aligned gate contact. This gate contact can extend through the dielectric layer and into the isolation region, can contact a side surface of the gate at the second end of the VFET, and can have a bottom above a level of the spacer layer.

Another embodiment of a method disclosed herein similarly includes forming, on a substrate, a vertical field effect transistor (VFET), an isolation region and an additional isolation region. The VFET can have a first end, a second end opposite the first end and opposing sides and can be formed so that it includes, but is not limited to: a semiconductor fin that extends vertically between a lower source/drain region in the substrate and an upper source/drain region; a cap layer on the upper source/drain region; a spacer layer on the lower source/drain region and laterally surrounding the semiconductor fin; a gate on the spacer layer and laterally surrounding the semiconductor fin; a source/drain sidewall spacer on the gate and laterally surrounding the upper source/drain region and the cap layer; and a gate sidewall spacer on the spacer layer and positioned laterally adjacent to the gate and the source/drain sidewall spacer at the first end of the VFET. The isolation region can be formed so that extends from within the substrate up through the spacer layer and is positioned laterally adjacent to the second end and the opposing sides of the VFET. The additional isolation region can be formed so that it is on the spacer layer and positioned laterally adjacent to the gate sidewall spacer at the first end of the VFET. In this case, the various components are formed such that an outer edge portion of the lower source/drain region extends laterally beyond the gate sidewall spacer at the first end of the VFET.

The method can further include forming a dielectric layer on the VFET and further extending over the isolation region, and the additional isolation region. After the dielectric layer is formed, contacts to the various VFET terminals can be formed. These contacts can include, but are not limited to: a self-aligned gate contact, a self-aligned lower source/drain contact, and an upper source/drain contact. The gate contact can extend through the dielectric layer and into the isolation region, can contact a side surface of the gate at the second end of the VFET, and can have a bottom above a level of the spacer layer. The lower source/drain contact can extend through the dielectric layer, the additional isolation region and the spacer layer down to the top surface of the outer edge portion of the lower source/drain region and can be positioned laterally immediately adjacent to the gate sidewall spacer at the first end of the VFET. The upper source/drain contact can extend through the dielectric layer and the cap layer to the top surface of the upper source/drain region.

Also disclosed herein are embodiments of a semiconductor structure formed according to the above-describe method embodiments. The semiconductor structure can include a vertical field effect transistor (VFET) on a substrate. This VFET can have a first end, a second end opposite the first end, and opposing sides and can include, but is not limited to, the following: a semiconductor fin that extends vertically between a lower source/drain region in the substrate and an upper source/drain region; a cap layer on the upper source/drain region; a spacer layer on the lower source/drain region and laterally surrounding the semiconductor fin; a gate on the spacer layer and laterally surrounding the semiconductor fin; and a source/drain sidewall spacer on the gate and laterally surrounding the upper source/drain region and the cap layer. It should be noted that an outer edge portion of the lower source/drain region can extend laterally beyond the gate at the first end. The semiconductor structure can further include multiple isolation regions. One isolation region can extend from within the substrate up through the spacer layer and is further positioned laterally adjacent the second end and the opposing sides of the VFET. An additional isolation region can be on the spacer layer and further positioned laterally adjacent to the first end of the VFET.

The semiconductor structure can further include a dielectric layer on the VFET and further extending laterally over the isolation region at the second end and opposing sides and over the additional isolation region at the first end. The semiconductor structure can further have contacts. The contacts can include a self-aligned gate contact, which extends through the dielectric layer and into the isolation region, is positioned laterally immediately adjacent to the gate at the second end of the VFET, and has a bottom that is above a level of the spacer layer. The contacts can also include a lower source/drain contact and an upper source/drain contact. The lower source/drain contact can extend through the dielectric layer, the additional isolation region and the spacer layer to the outer edge portion of the lower source/drain region at the first end of the VFET. The upper source/drain contact can extend through the dielectric layer and the cap layer to the upper source/drain region. Optionally, the VFET can further include a gate sidewall spacer on the spacer layer and positioned laterally adjacent to and between the first end of the VFET and the additional isolation region. In this case, the outer edge portion of the lower source/drain region will extend laterally beyond the gate sidewall spacer at the first end of the VFET and the lower source/drain contact will be positioned laterally immediately adjacent to the gate sidewall spacer and will be self-aligned.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1:
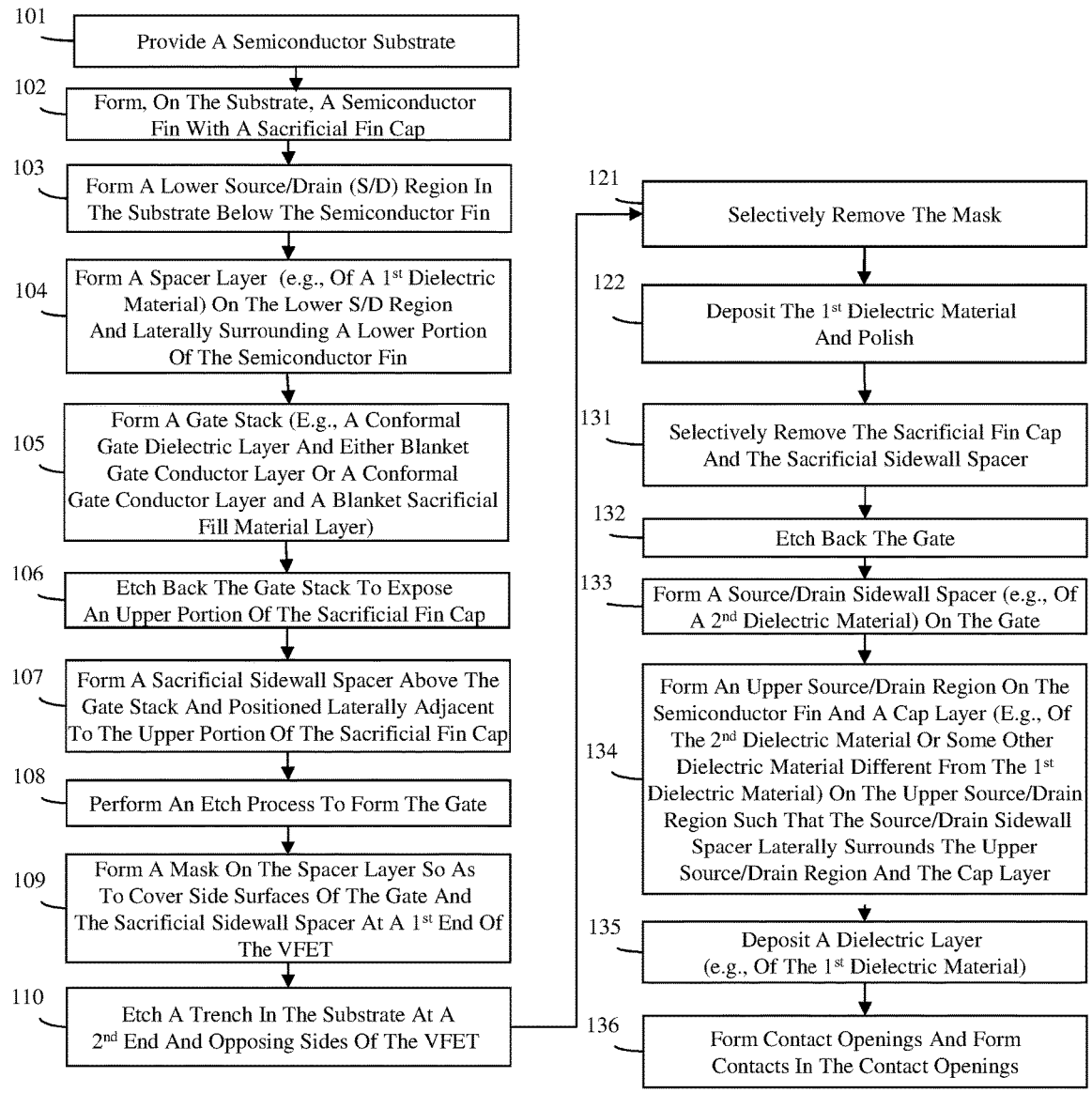
FIG. 1 is a flow diagram illustrating an embodiment of a method of forming a semiconductor structure.

As mentioned above, as device density (i.e., the number of devices per unit area) of integrated circuit (IC) designs continues to be increased, forming vertical field effect transistors (VFETs) without violating design rules and/or risking the formation of defects (e.g., gate contact-to-upper source/drain region shorts, lower source/drain contact-to-gate shorts, etc.) can be difficult. For example, recently IC designs have been developed with a reduced fin pitch of 36 nm or less in order to increase device density in an array of VFETs. This reduction in fin pitch necessarily requires a corresponding reduction in the gate pitch to minimize parasitic capacitance. One recently developed technique for reducing gate pitch is the formation of a self-aligned gate (i.e., a gate where the shape of the gate is define during an etch process that uses a sidewall spacer formed on the gate stack as a mask). However, forming a gate contact to such a gate is problematic and typically requires the formation of a gate extension in order to provide a landing surface for the gate contact. Unfortunately, the added gate extension consumes additional chip area and, thus, cancels out any scaling benefit that could be achieved by reducing the fin pitch and the gate pitch.

In view of the foregoing, disclosed herein are embodiments of a method of forming a semiconductor structure that includes one or more vertical field effect transistors (VFETs) and one or more self-aligned contacts including a self-aligned gate contact and, optionally, a self-aligned lower source/drain contact. In the method embodiments, a VFET and an isolation region can be formed on a substrate. The VFET can be formed with a semiconductor fin extending vertically between lower and upper source/drain regions, a spacer layer and a gate laterally surrounding the semiconductor fin, a source/drain sidewall spacer laterally surrounding the upper source/drain region and, optionally, a gate sidewall spacer positioned laterally immediately adjacent to the gate at a first end of the VFET. The isolation region can be formed so that it is positioned laterally immediately adjacent to the gate at a second end and on opposing sides of the VFET and so that it extends downward through the spacer layer and into the substrate. Contacts can be formed to the terminals of the VFET and these contacts can include, but are not limited to, a lower source/drain contact (which is adjacent to the first end of the VFET, extends to the lower source/drain region, and is self-aligned if the optional gate sidewall spacer is present) and a self-aligned gate (which extends into the isolation region at the second end of the VFET, contacts a side surface of the gate, and has a bottom above the spacer layer). Also disclosed herein are embodiments of a semiconductor structure formed according to the method. In any case, in the disclosed embodiments the self-aligned gate contact eliminates the need for a gate extension and the optional self-aligned lower source/drain contact minimizes the possibility of a source/drain contact to gate short. Thus, the disclosed embodiments enable device density to be increased with minimal impact on performance.

The flow diagram of FIG. 1 along with FIGS. 2A-6B and 7A-14B illustrate a method embodiment for forming a semiconductor structure 200 that includes at least one vertical field effect transistor (VFET) 210, 220 with a self-aligned gate contact 283. The flow diagram of FIG. 15 along with FIGS. 2A-6B and 16A-26B illustrate a method embodiment for forming a semiconductor structure 200' that includes at least one vertical field effect transistor (VFET) 210, 220 with a self-aligned gate contact 283 and also a self-aligned lower source/drain contact 281'.

Figure 2A:
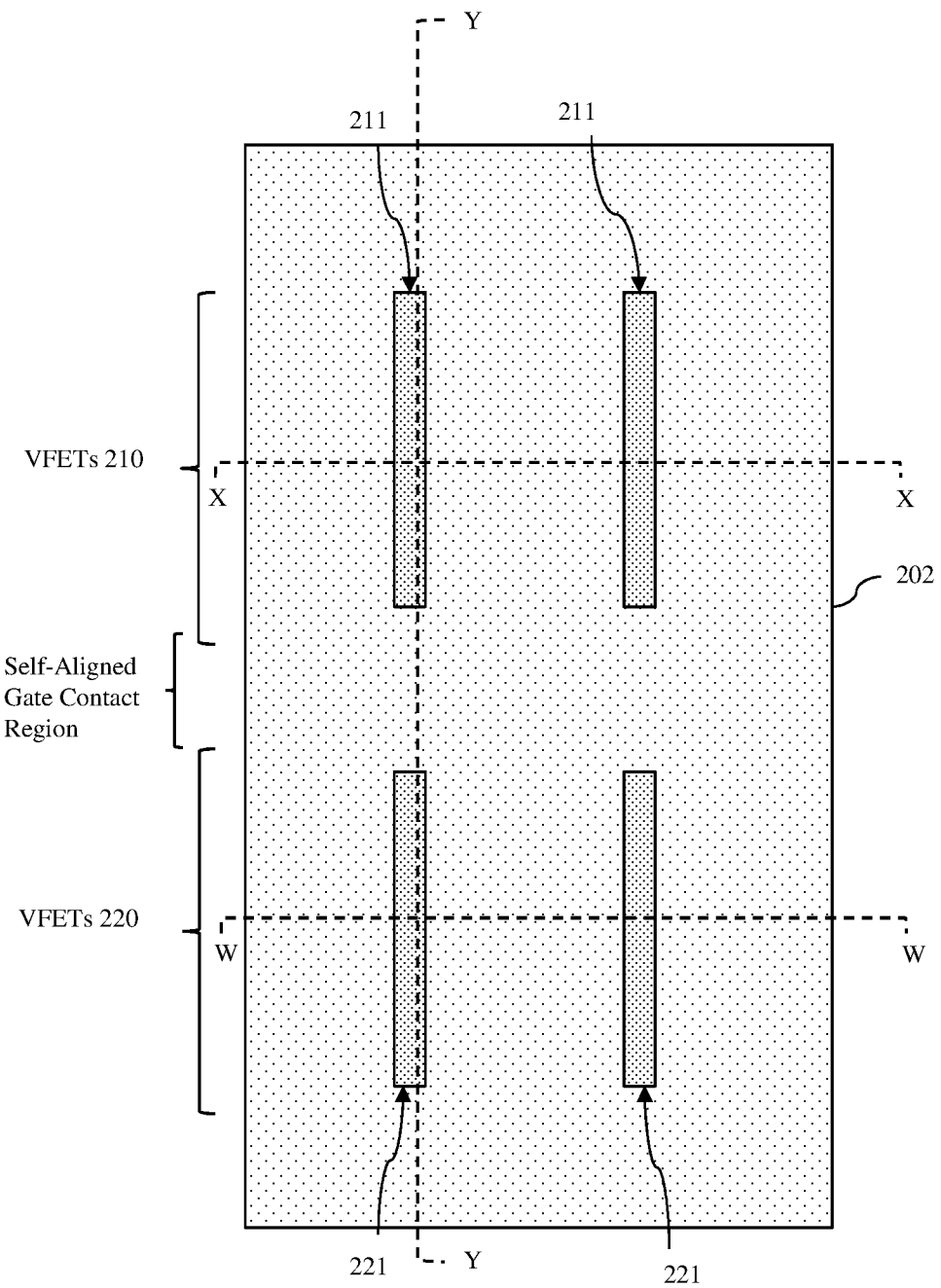
FIG. 2A and FIGS. 2B-2C are a top view and different cross section diagrams, respectively, of a partially completed structure formed according to the flow diagram of FIG. 1.
Figure 2B:
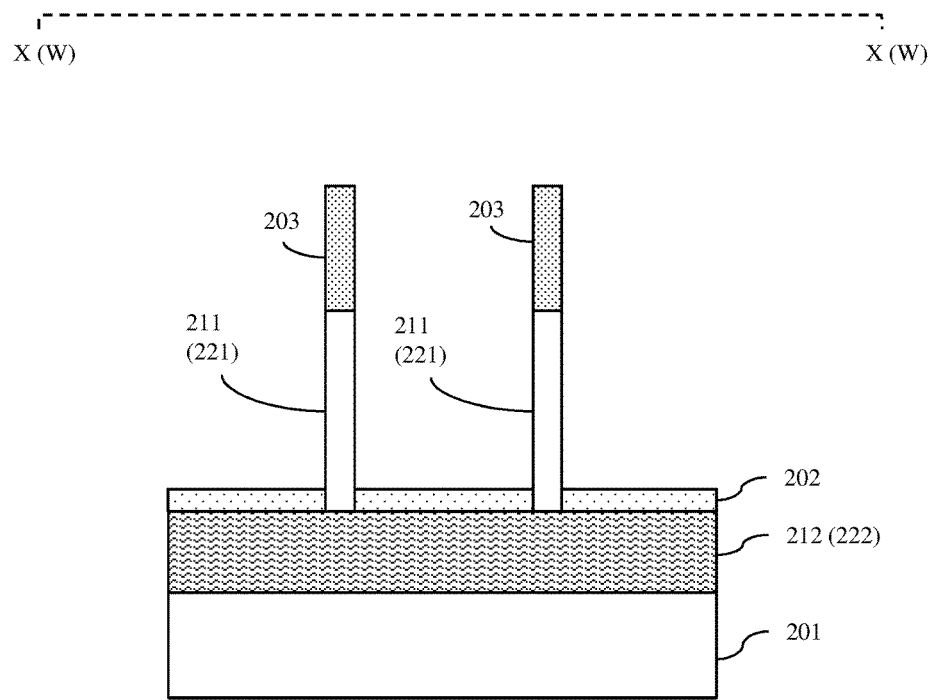
Figure 2C:
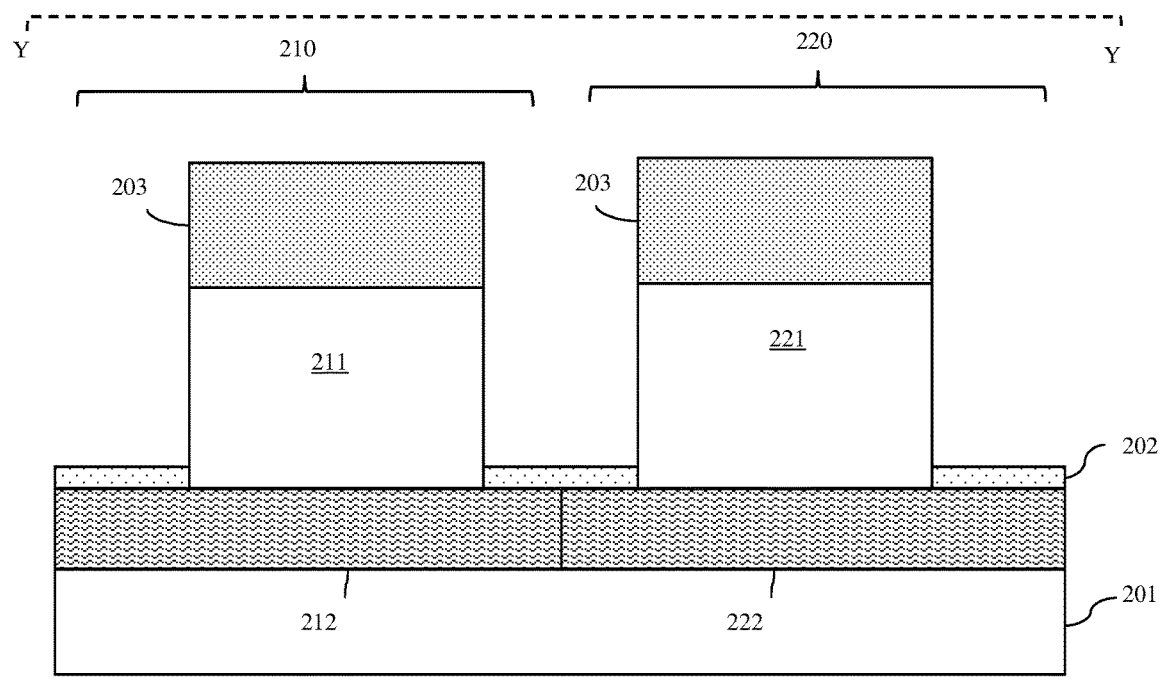
Figure 15:
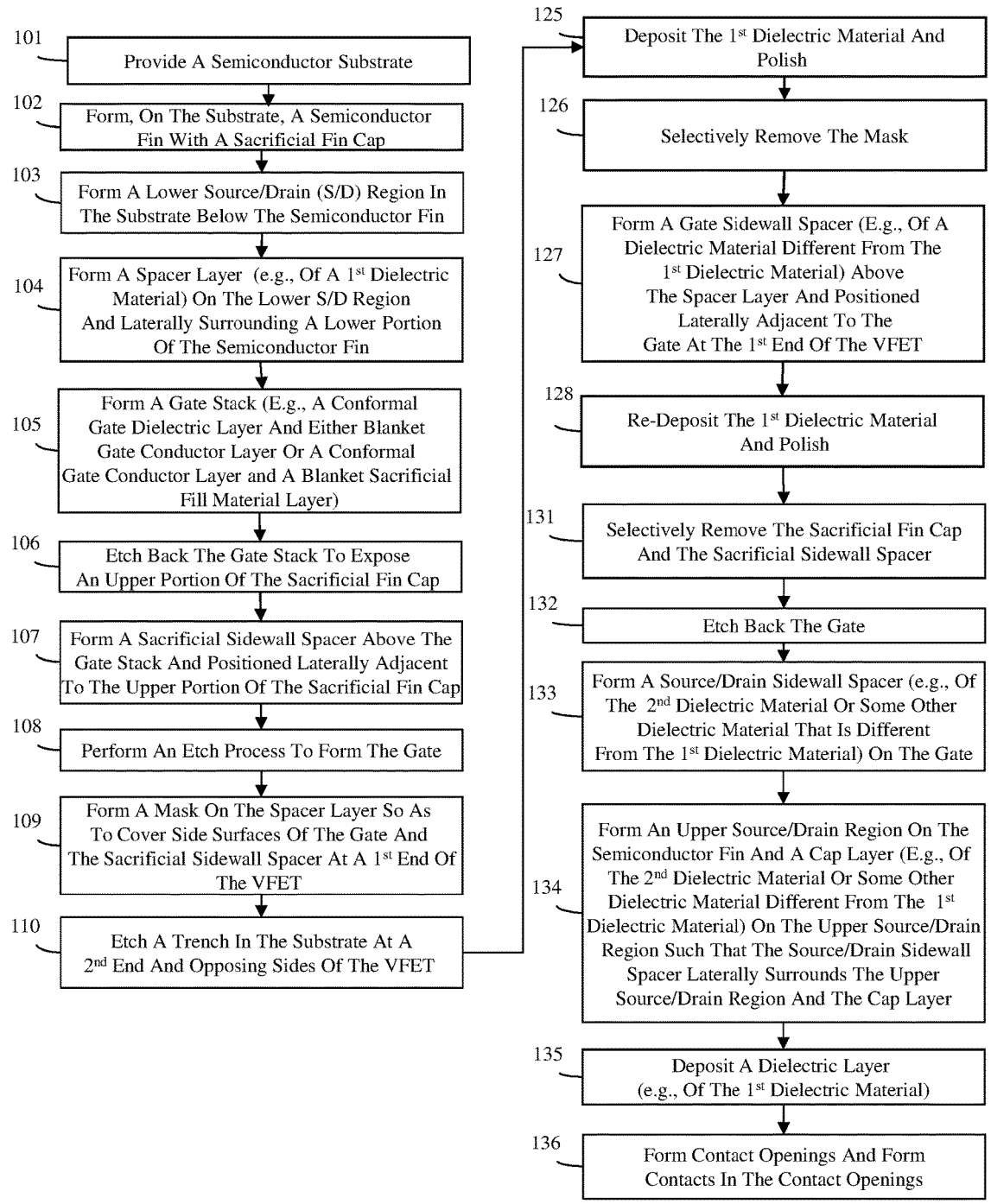
FIG. 15 is a flow diagram illustrating another embodiment of a method of forming a semiconductor structure.
Figure 16A:
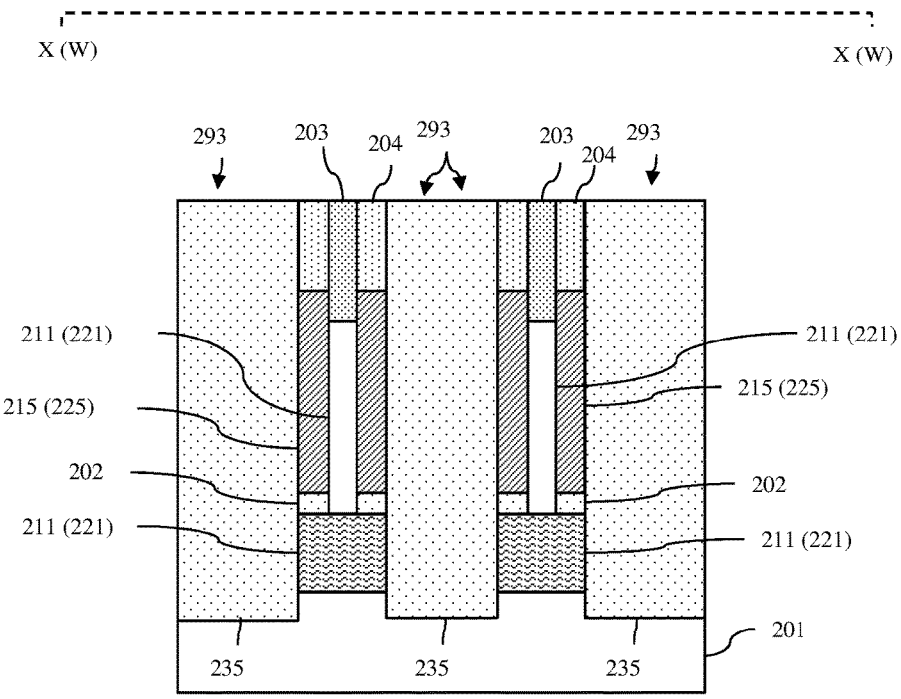
FIGS. 16A and 16B are different cross section diagrams of a partially completed structure formed according to the flow diagram of FIG. 15.
Figure 16B:
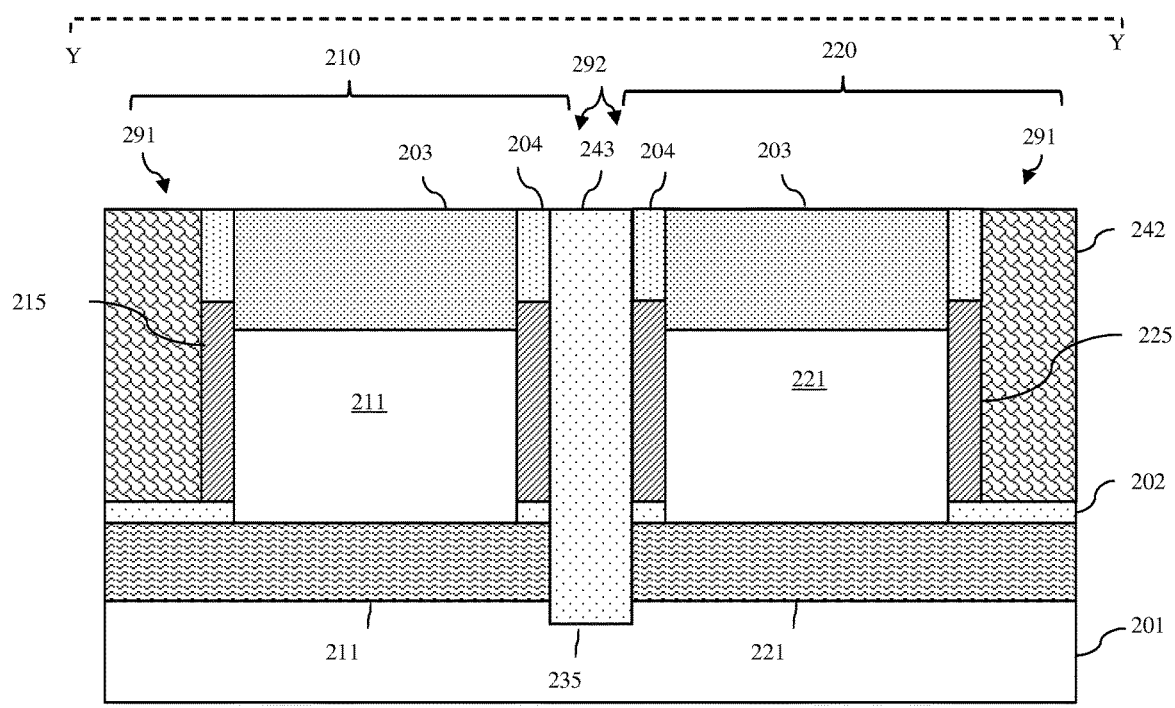
Figure 17A:
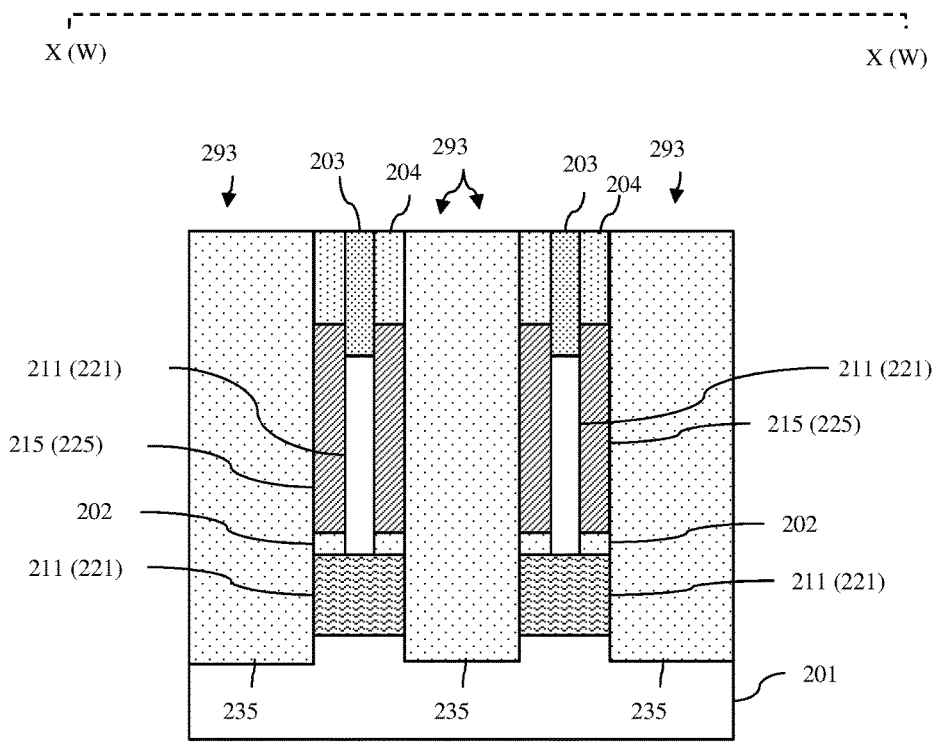
FIGS. 17A and 17B are different cross section diagrams of a partially completed structure formed according to the flow diagram of FIG. 15.
Figure 17B:
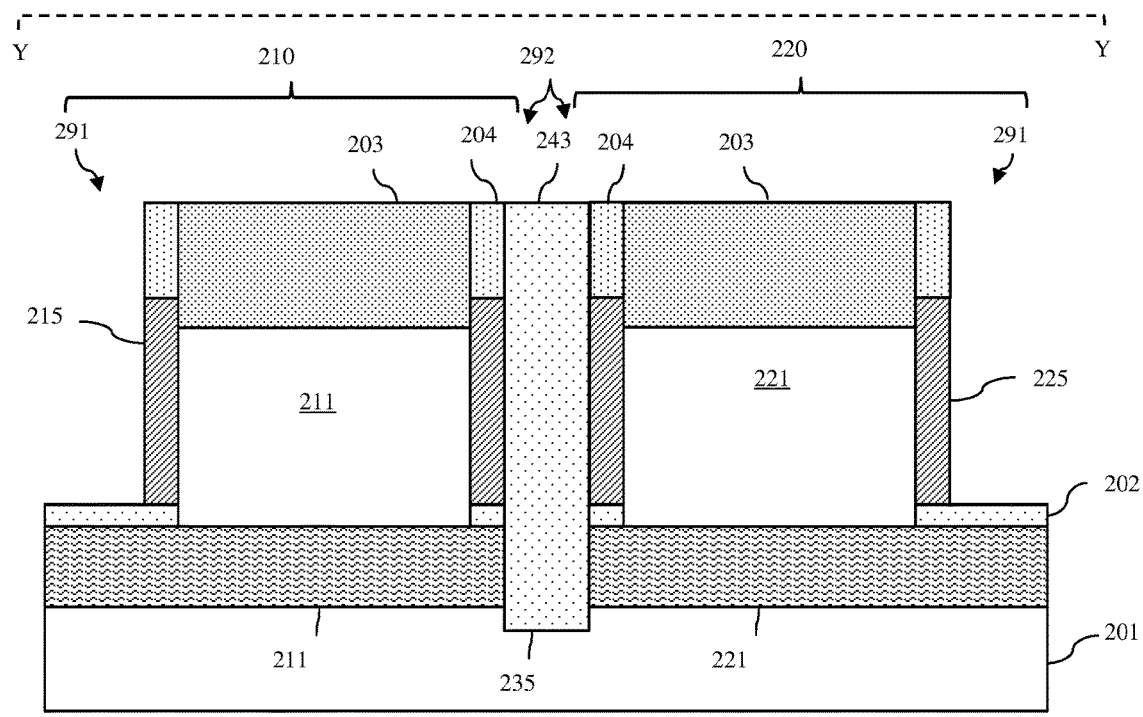

Referring to the flow diagrams of FIG. 1 and FIG. 15, each of the method embodiments disclosed herein can include providing a semiconductor substrate (see process 101, see FIGS. 2A-2C). The semiconductor substrate 201 can be a bulk semiconductor substrate (e.g., a bulk silicon substrate), as illustrated. Alternatively, the semiconductor substrate 201 can be a semiconductor layer of a semiconductor-on-insulator structure (e.g., a silicon layer of a silicon-on-insulator (SOI) structure). At least one semiconductor fin with a sacrificial fin cap can be formed on the semiconductor substrate (see process 102 and FIGS. 2A-2C). For purposes of this disclosure, a semiconductor fin is relatively thin essentially rectangular shaped semiconductor body that extends essentially vertically upward from a surface of the substrate. Techniques for patterning capped semiconductor fins (e.g., conventional lithographic patterning techniques, sidewall image transfer patterning techniques, etc.) are well known in the art and, thus, the details have been omitted from the specification in order to allow the reader to focus on the salient aspects of the disclosed embodiments.

For purposes of illustration, the method embodiments will be described below and illustrated in the figures with respect to the formation of four semiconductor fins including two parallel semiconductor fins 211, which will be used to form two P-type VFETs 210 and two parallel semiconductor fins 221, which are in end-to-end alignment with the two parallel semiconductor fins 211 and which will be used to form two N-type VFETs 220. For purposes of this disclosure, semiconductor fins that are in "end-to-end" alignment will be oriented in the same direction along the substrate and aligned such that an end of one semiconductor fin 211 is adjacent to, but physically separated from, an end of another semiconductor fin 221.

It should be noted that FIG. 2A is a top view diagram, which illustrates a partially completed semiconductor structure and which further identifies three different cross-sections: XX traversing the widths of the parallel semiconductor fins 211 of the P-type VFETs 210; WW traversing the widths of the parallel semiconductor fins 221 of the N-type VFETs 220; and YY which is essentially perpendicular to the cross-sections XX and WW and, specifically, cuts along the lengths of a semiconductor fin 211 of a P-type VFET 210 and an adjacent semiconductor 221 of an N-type VFET 220. FIG. 2B shows the cross-section XX. Additionally, since, in the disclosed method embodiments, the cross-sections XX and WW will be essentially the same, FIG. 2B also identifies components of cross-section WW using parentheses. FIG. 2C shows the cross-section YY. These same cross-sections XX (WW) and YY will be used to illustrate the remaining process steps in each of the different method embodiments. It should be understood that these figures are not intended to be limiting and that the method embodiments disclosed herein could, alternatively, be used to form a single P-type or N-type VFET, multiple VFETs of the same type or a different number of VFETs of different types.

In any case, in each of the method embodiments, the semiconductor fins 211, 221 formed at process 102 can be undoped. Alternatively, these semiconductor fins 211, 221, which will function as the channel regions of the VFETs 210, 220, respectively, can be doped. For example, for P-type VFETs 210, the semiconductor fins 211 can be doped so as to have N-type conductivity at a relatively low conductivity level (i.e., N− conductivity), whereas for N-type VFETs 220, the semiconductor fins 221 can be doped so as to have P-type conductivity at a relatively low conductivity level (i.e., P− conductivity).

Additionally, lower source/drain regions 212, 222 can be formed in the semiconductor substrate 201 below the semiconductor fins 211, 221 (see process 103 and FIGS. 2A-2C). Techniques for forming lower source/drain regions in a semiconductor substrate for VFETs (e.g., dopant implantation processes to form doped well regions within the semiconductor substrate below the semiconductor fins; trench etch and fill processes to form doped epitaxial semiconductor regions below the semiconductor fins; etc.) are well known in the art and, thus, the details of these techniques have been omitted from this specification in order to allow the reader to focus on the salient aspects of the disclosed methods. In any case, the lower source/drain regions 212, 222 will be doped and the conductivity type thereof will vary depending upon the conductivity type of the VFETs being formed. For example, for P-type VFETs 210, the lower source/drain regions 212 can be doped so as to have P-type conductivity at a relatively high conductivity level (i.e., P+ conductivity), whereas for N-type VFETs 220, the lower source/drain regions 222 can be doped so as to have N-type conductivity at a relatively high conductivity level (i.e., N+ conductivity).

A spacer layer 202 can be deposited so as to cover the lower source/drain regions 212, 222 and then recessed to expose all but the lower portions of the semiconductor fins 211, 221 (see process 103 and FIGS. 2A-2C). Thus, following process 103, the spacer layer 202 will cover the lower source/drain regions 212, 222 and will laterally surround only the lower portions of the semiconductor fins 211, 221. The spacer layer 202 can be made of a first dielectric material (e.g., silicon dioxide). Alternatively, the spacer layer 202 can be made of some different dielectric material. For example, the spacer layer 202 can be made of a low-K dielectric material (i.e., a dielectric material having a dielectric constant below that of silicon dioxide and, particularly, below 3.9, such as carbon-doped silicon dioxide, porous silicon dioxide, etc.). As mentioned above, the semiconductor fins 211, 221 can be capped with sacrificial fin caps 203. These sacrificial fin caps 203 can be made of a second dielectric material (e.g., silicon nitride) that is different from the dielectric material of the spacer layer 202.

Figure 3A:
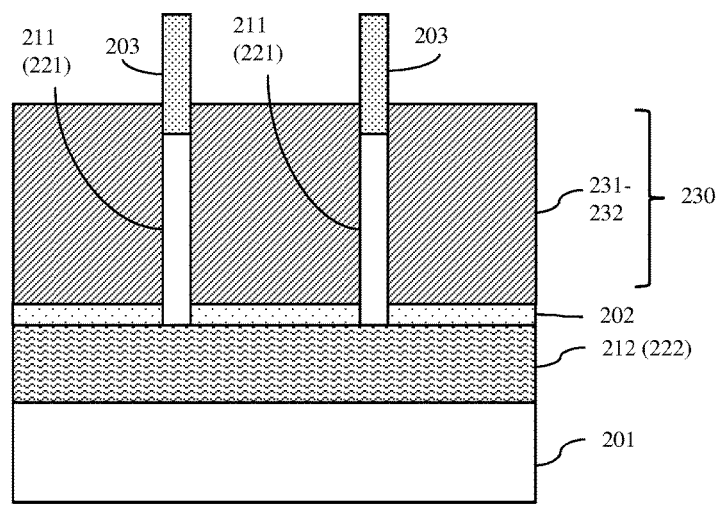
FIGS. 3A and 3B are different cross section diagrams of a partially completed structure formed according to the flow diagram of FIG. 1.
Figure 3B:
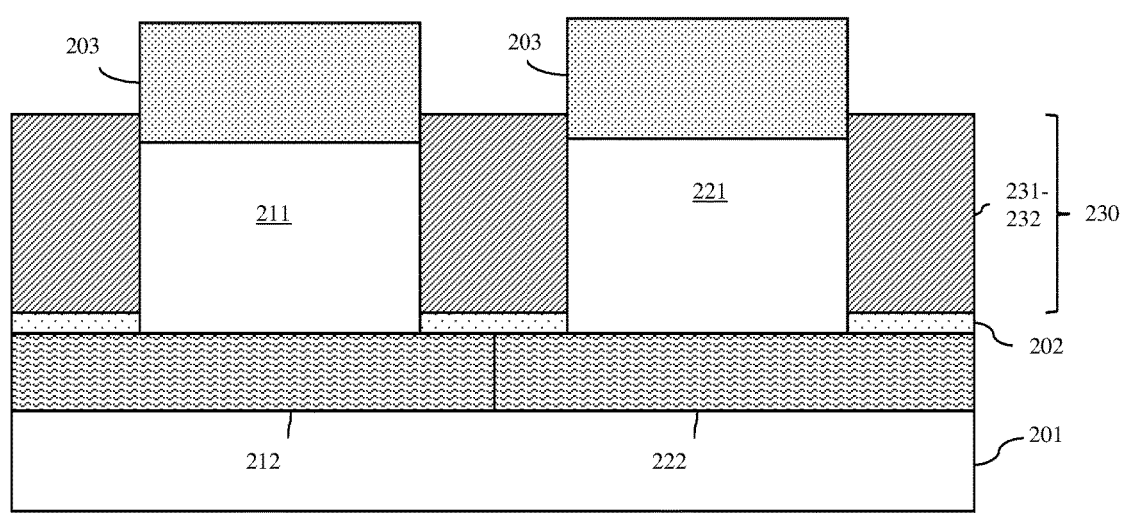
Figure 4A:
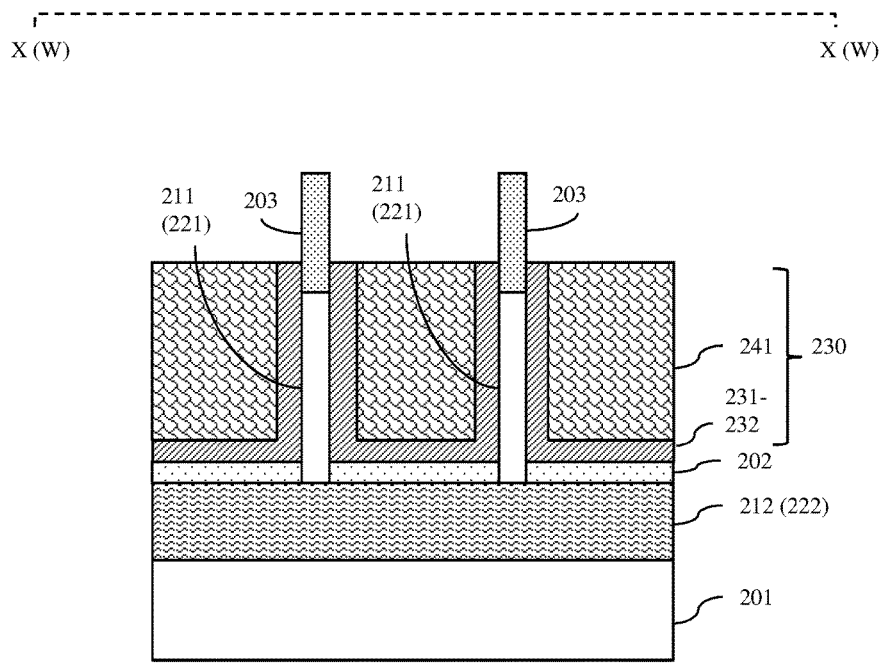
FIGS. 4A and 4B are different cross section diagrams of a partially completed structure formed according to the flow diagram of FIG. 1.
Figure 4B:
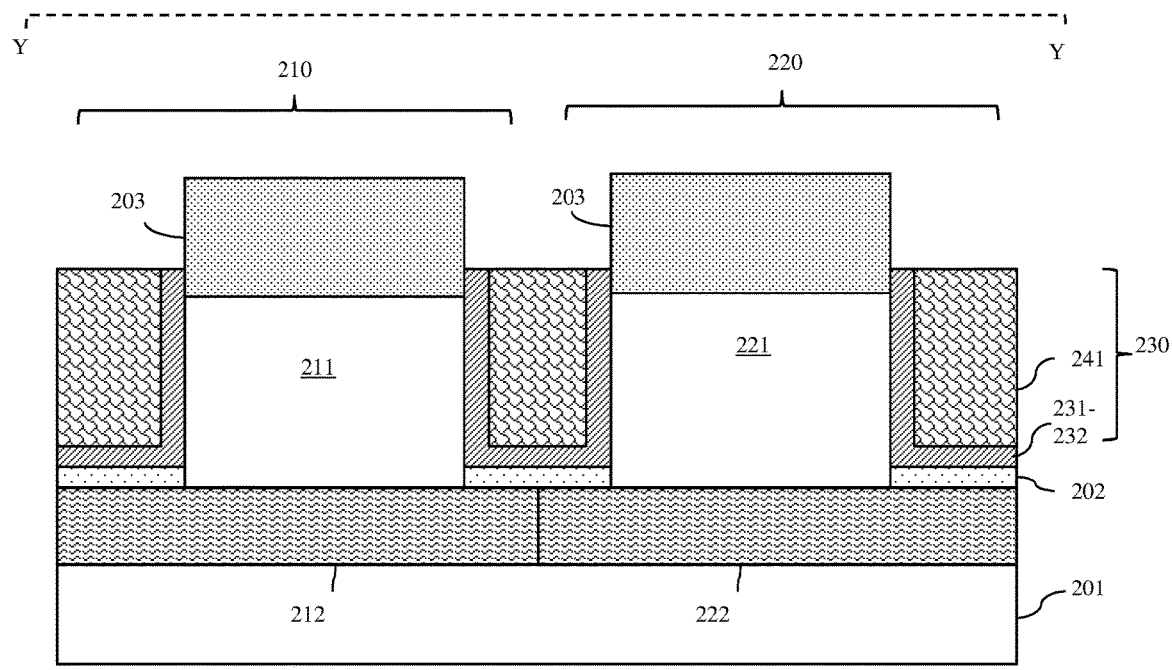

After the spacer layer 202 is deposited and recessed, a gate stack 230 can be formed on the spacer layer 202 such that it is positioned laterally adjacent to the sidewalls of the semiconductor fins 211, 221 and further such that a top surface of the gate stack is at a level between the top surfaces of the semiconductor fins 211, 221 and the top surfaces of the sacrificial fin caps 203 on the semiconductor fins 211, 221 (i.e., such that upper portions of the sacrificial fin caps 203 extend vertically above the gate stack 230) (see process 105 and FIGS. 3A-3B or FIGS. 4A-4B). As shown in FIGS. 3A-3B, the gate stack 230 can be formed by depositing at least one conformal gate dielectric layer 231 (e.g., a conformal high-K gate dielectric layer) over the semiconductor fins 211, 221 and the spacer layer 202, depositing at least one gate conductor layer 232 (e.g., a blanket metal layer) on the conformal gate dielectric layer so as to fill the spaces between the semiconductor fins, and then recessing the resulting gate stack 230. Alternatively, as shown in FIGS. 4A-4B, the gate stack 230 can be formed by depositing at least one conformal gate dielectric layer 231 (e.g., a conformal high-K gate dielectric layer) over the semiconductor fins 211, 221 and the spacer layer 202, depositing a conformal gate conductor layer 232 (e.g., a conformal metal layer) on the conformal gate dielectric layer, depositing a blanket sacrificial fill material layer 241 (e.g., an optical polymerization layer (OPL) or other suitable sacrificial fill material) to fill the spaces between the semiconductor fins, and then recessing the resulting gate stack 230.

The gate conductor material(s) used for the gate stacks 230 of the P-type VFETs 210 and for the N-type VFETs 220 can be the same gate conductor material(s). Alternatively, discrete processes could be used to form different gate stacks for the P-type VFETs 210 and for the N-type VFETs 220 so that the gate conductor material(s) thereof have different work functions (see the detailed discussion of exemplary work function metals below). It should be noted that various different configuration for VFET gate stacks are well known in the art. Thus, in order to avoid clutter in the drawings and allow the reader to focus on the salient aspects of the disclosed embodiments, only the gate stacks 230, as a whole, are identified in the figures and the individual components of these gate stacks 230 (e.g., the gate dielectric and conductor layers 231-232) are not specifically illustrated.

Sacrificial sidewall spacers 204 can subsequently be formed on the gate stack 230 adjacent to the exposed sidewalls of the upper portions of the sacrificial fin caps 203 (i.e., laterally surrounding the upper portions of the sacrificial fin caps 203) (see process 107 and FIGS. 5A-5B). Conventional sidewall spacer formation techniques can be used to form the sacrificial sidewall spacers 203. That is, a sacrificial sidewall spacer layer can be conformally deposited over the partially completed structure and an anisotropic etch process can be performed remove the sidewall spacer material from horizontal surfaces. The sacrificial sidewall spacers 203 can be made of the second dielectric material (e.g., silicon nitride). Alternatively, the sacrificial sidewall spacer can be made of any other suitable dielectric material that is different from the first dielectric material (e.g., silicon dioxide) and different from the dielectric material of the spacer layer 202 (e.g., if the spacer layer 202 is a low-K dielectric material).

Figure 5A:
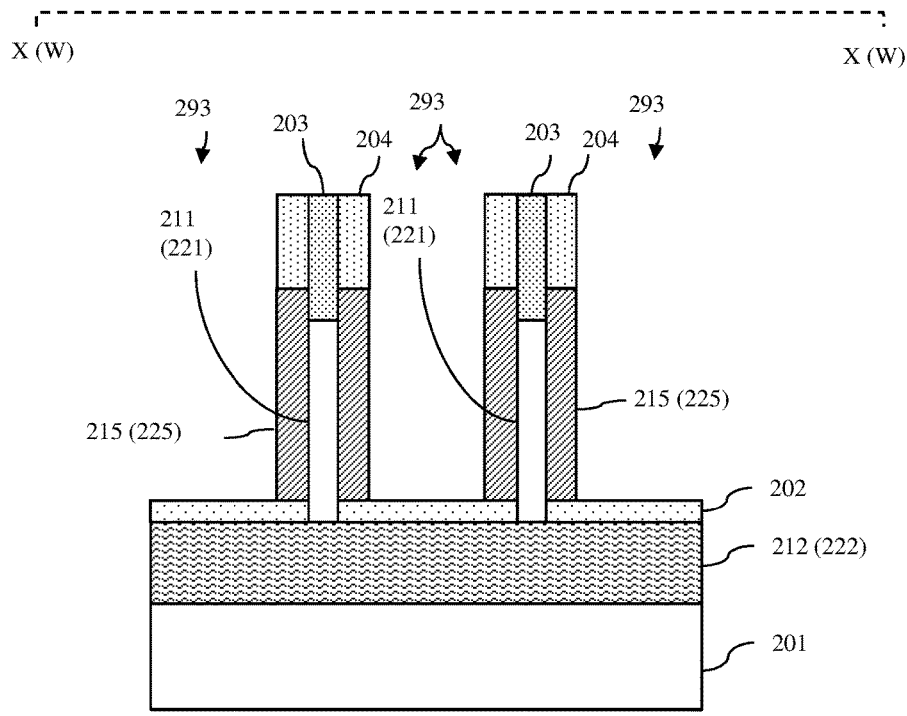
FIGS. 5A and 5B are different cross section diagrams of a partially completed structure formed according to the flow diagram of FIG. 1.
Figure 5B:
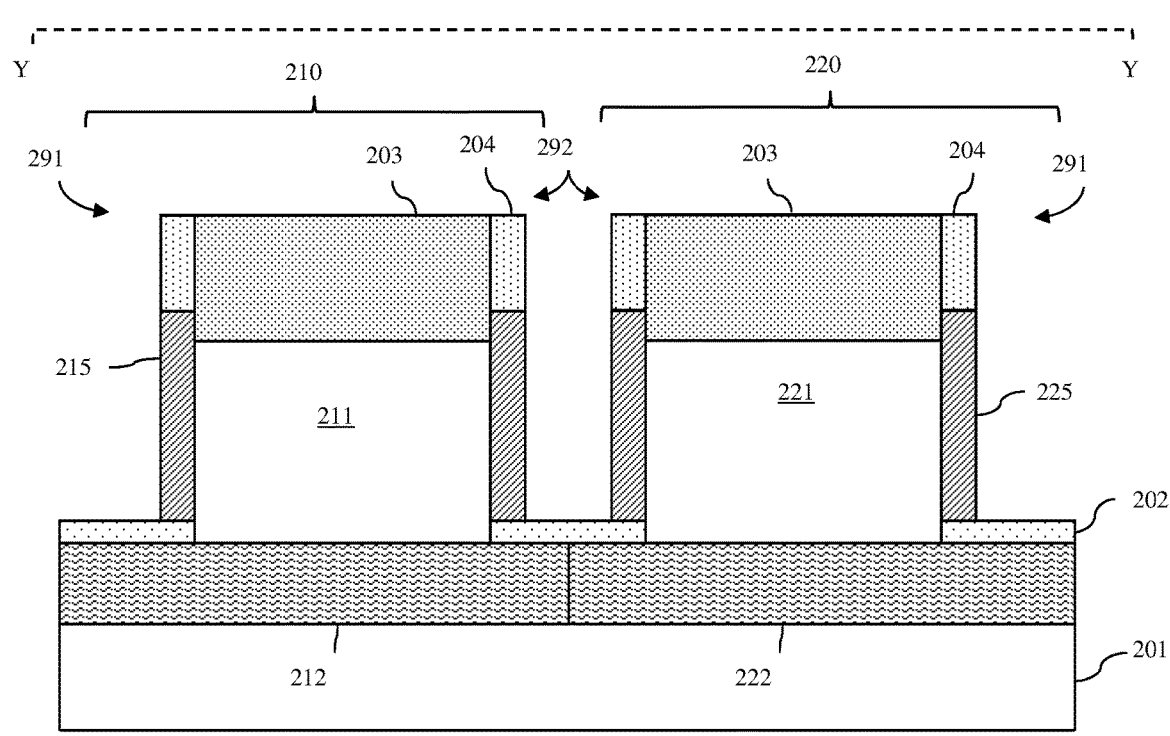

Next, an anisotropic etch process can be performed using the sacrificial sidewall spacers 204 as masks to form gates 215 around the semiconductor fins 211 for the P-type VFETs 210 and to further form gates 225 around the semiconductor fins 221 for the N-type VFETs 220 (see process 108 and FIGS. 5A-5B). It should be understood that the thickness of the sacrificial sidewall spacers 204 defines the thicknesses of the gates 215, 225. Thus, if the gate stack 230 is formed so as to include a conformal gate conductor layer and sacrificial fill material 241 (as shown in FIGS. 4A-4B), the thickness of the sacrificial sidewall spacer layer and, thereby the thicknesses of the sacrificial sidewall spacers 204 should be less than or equal to the thickness of the conformal gate conductor layer so that, when the anisotropic etch process 108 is performed to form the gates 215, 225, the sacrificial fill material 241 is substantially and, preferably completely removed. Thus, regardless of whether the gate stack 230 is formed as shown in FIGS. 3A-3B or as formed in FIGS. 4A-4B, the anisotropic etch process 108 should result in the partially completed structure shown in FIGS. 5A-5B. As illustrated, each VFET 210, 220 being formed will have a first end 291, a second end 292 opposite the first end 291 and opposing sides 293. In the example provided, the first end 291 of each semiconductor fin 211 is an outer end and the second end 292 is an inner end, which is aligned with the inner end of an adjacent semiconductor fin 221.

Figure 6A:
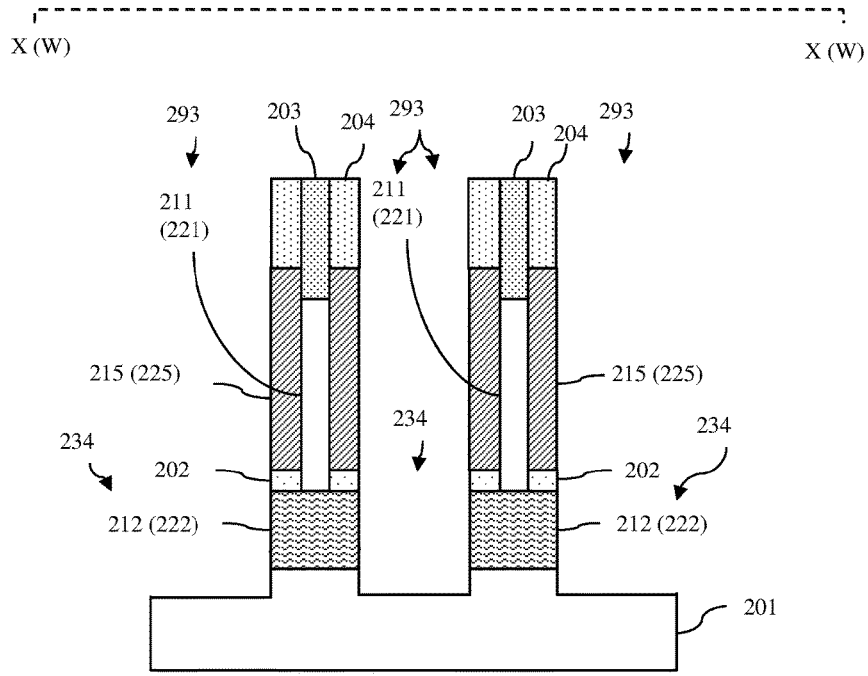
FIGS. 6A and 6B are different cross section diagrams of a partially completed structure formed according to the flow diagram of FIG. 1.
Figure 6B:
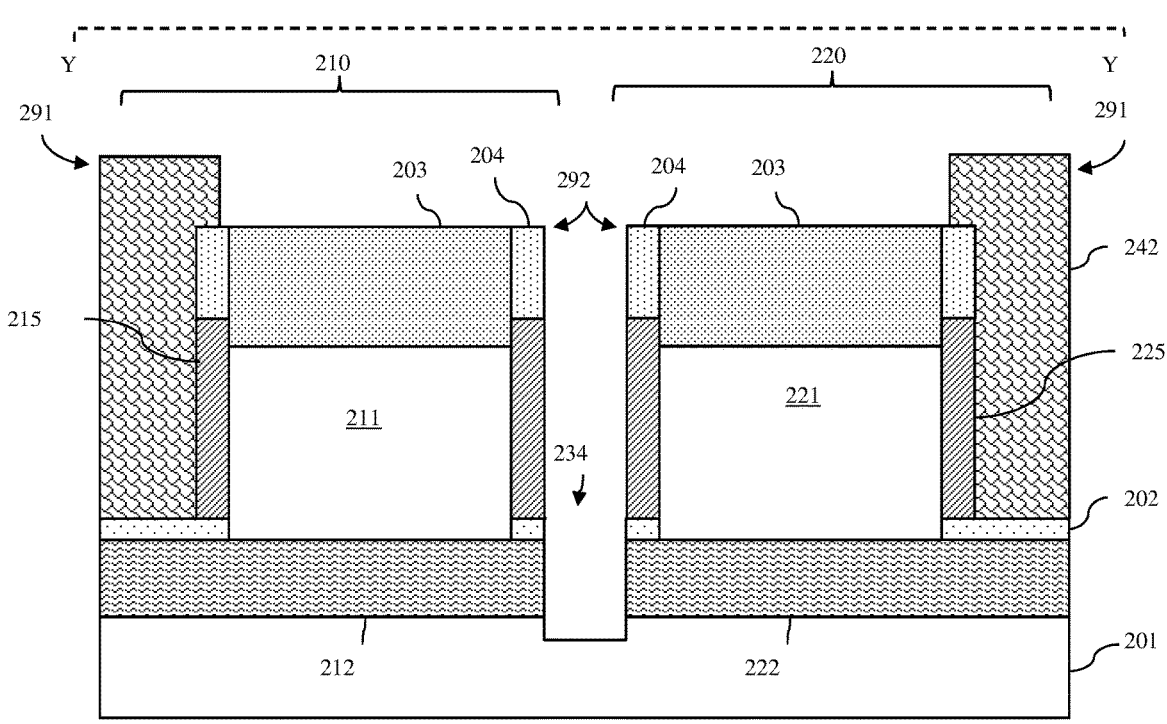
Figure 7A:
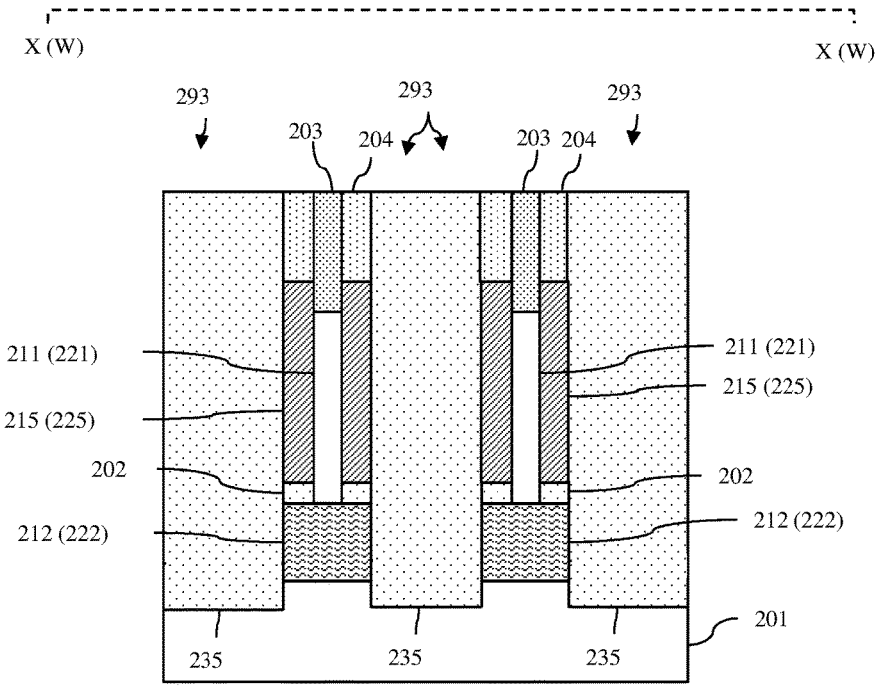
FIGS. 7A and 7B are different cross section diagrams of a partially completed structure formed according to the flow diagram of FIG. 1.
Figure 7B:
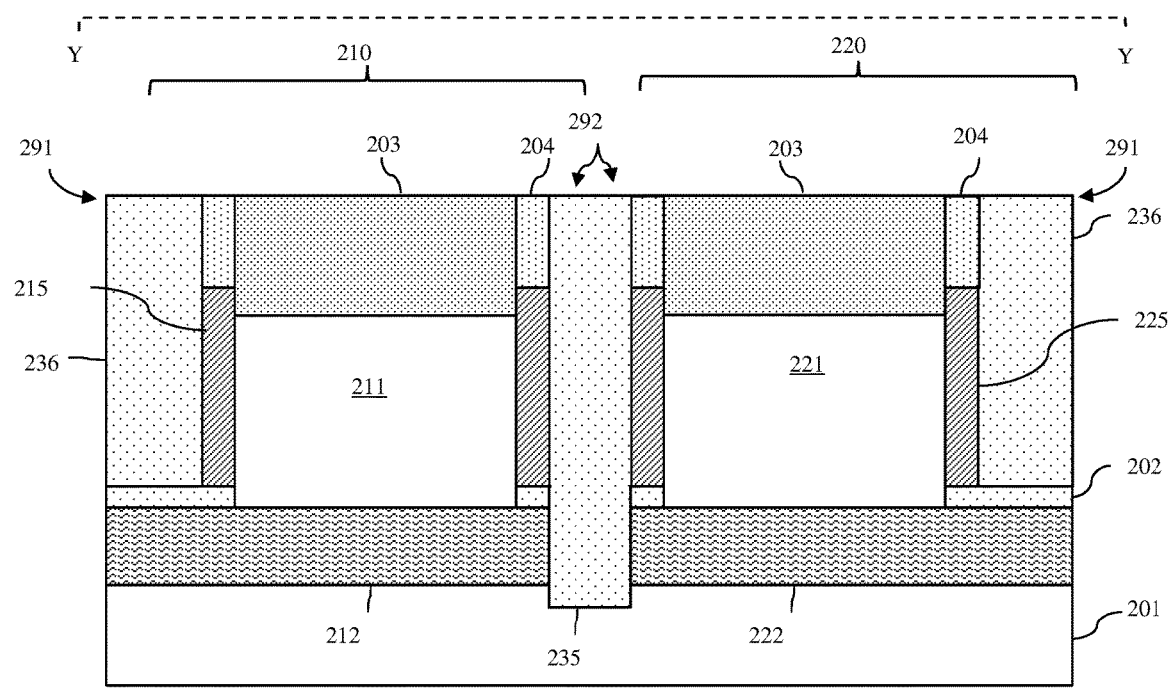

Once the gates 215, 225 are formed, masks 242 can be formed on the spacer layer 202 at the first ends 291 (i.e., outer ends) of the VFETs 210, 220 so as to be positioned laterally immediately adjacent to the gates 215, 225 and the source/drain sidewall spacers 204 (see process 109 and FIGS. 6A-6B). For example, a mask layer (e.g., a OPL layer) can be deposited and then lithographically patterned and etched to expose the opposing sides 293 and the second ends 292 (i.e., inner ends) of the VFETs 210, 220 as well as the top surface of the spacer layer 202 adjacent to and between the opposing sides 293 and the second ends 292 of those VFETs 210, 220, thereby forming the masks 242. The remaining masks 242 cover the vertical surfaces of the gates 215, 225 at the first ends 291 of the VFETs 210, 220.

Selective anisotropic etch processes can then be performed to etch trenches 234 through the exposed portions of the spacer layer 202 and into the semiconductor substrate 201 below (see process 110 and FIGS. 6A-6B). The trenches 234 will be on the opposing sides 293 and second end 292 of each VFET 210, 220 and will extend vertically into the semiconductor substrate 201 to some depth below the bottom of the lower source/drain regions 212, 222, thereby physically separating the lower source/drain regions 212, 222 of the VFETs 210, 220 and defining the shapes thereof. Since the sacrificial fin caps 203 and the sacrificial sidewall spacers 204 are made of, for example, the second dielectric material (e.g., silicon nitride) and, particularly, a different dielectric material than the spacer layer 202, the sacrificial fin caps and sacrificial sidewall spacers 204 will remain intact and protect the semiconductor fins 211, 221 during this trench formation process.

It should be noted that, for purposes of illustration, each VFET 210, 220 is shown as including a single semiconductor fin above a lower source/drain region. However, those skilled in the art will recognize that, alternatively, a VFET may include multiple parallel semiconductor fins on the same lower source/drain region. In this case, the mask 242 would be patterned at process 109 so as to have section(s) that extend between adjacent parallel semiconductor fins of the same VFET, but not between adjacent parallel semiconductor fins of different VFETs.

The method embodiments disclosed in FIGS. 1 and 15 are slightly different following process 110.

Referring specifically to the flow diagram of FIG. 1, the masks 242 can be selectively removed immediately after the trench is etched at process 110 (see process 121). The first dielectric material (e.g., silicon dioxide) can then be deposited and planarized (e.g., using a chemical mechanical polishing (CMP) process) so as to expose the top surfaces of the sacrificial fin caps 203 and sacrificial sidewall spacers 204 (see process 122 and FIGS. 7A-7B). As a result of processes 110 and 121-122 of FIG. 1, isolation regions 235 are formed at the second end 292 and at the opposing sides 293 of each of the VFETs 210, 220. Specifically, these isolation regions 235 have lower portions, which are within the semiconductor substrate 201 and electrically isolate adjacent lower source/drain regions 212, 222. These isolation regions 235 further extend upward through the spacer layer 202 and are positioned laterally immediately adjacent to the gates 215, 225 of each VFET at the opposing sides 293 and the second ends 292. Additionally, as a result of processes 110 and 121-122 the same first dielectric material (e.g., silicon dioxide) that is used to form the isolation regions 235 also fills the areas above the spacer layer 202 at the first ends 291 of the VFET 210, 220, thereby forming additional isolation regions 236.

Additional processes can then be performed in order to complete each of the VFETs 210, 220. Specifically, the sacrificial fin caps 203 and sacrificial sidewall spacers 204 can be selectively removed (e.g., using a selective reactive ion etch (RIE) process) (see process 131 and FIGS. 8A-8B). The gates 215, 225 of the VFETs 210, 220 can then be etched back so that the top surface of each gate 215, 225 is below the level of the top surface of the adjacent semiconductor fin 211, 221 (see process 132 and FIGS. 9A-9B). Etching back of the gates 215, 225 can be performed using, for example, a selective isotropic etch process to ensure that the heights of the gates 215, 225 (which will correspond to the gate lengths) will be essentially uniform (i.e., the same across the semiconductor structure). Once the gates 215, 225 are etched back, source/drain sidewall spacers 244 can be formed above those gates 215, 225 and positioned laterally immediately adjacent to the exposed vertical surfaces of the isolation regions 235, 236 (see process 133 and FIGS. 10A-10B). Conventional sidewall spacer formation techniques can be used to form the source/drain sidewall spacers 244. That is, a source/drain sidewall spacer layer can be conformally deposited over the partially completed structure, followed by an anisotropic etch process to remove the sidewall spacer material from horizontal surfaces. The source/drain sidewall spacers 244 can be made of the second dielectric material (e.g., silicon nitride). Alternatively, the source/drain sidewall spacers 244 can be made of any other suitable dielectric material that is different from the first dielectric material (e.g., silicon dioxide).

Figure 10A:
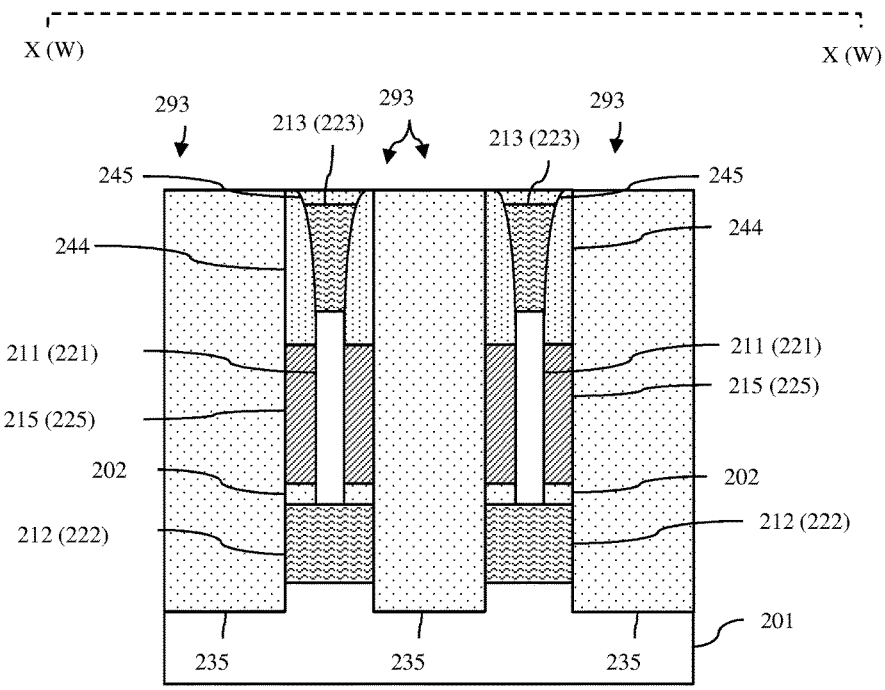
FIGS. 10A and 10B are different cross section diagrams of a partially completed structure formed according to the flow diagram of FIG. 1.
Figure 10B:
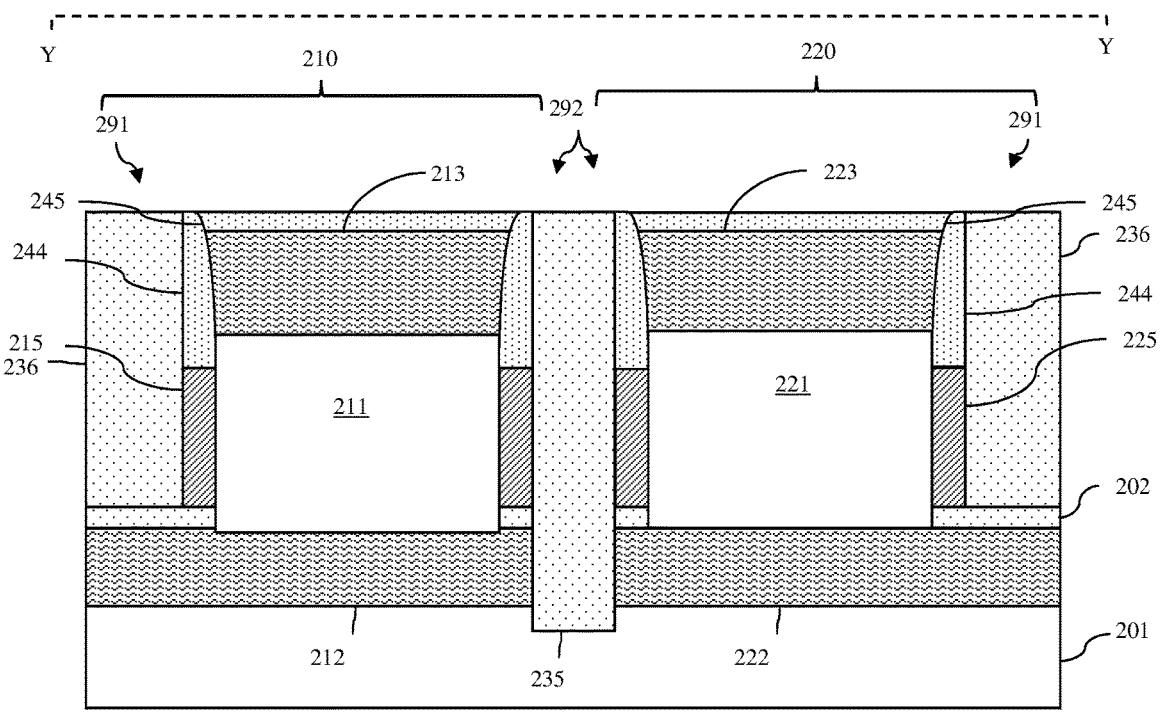

Upper source/drain regions 213, 223 can then be formed on the exposed tops of the semiconductor fins 211, 221 so as to be laterally surrounded by the source/drain spacers 244 (see process 134 and FIGS. 10A-10B). The upper source/drain regions 213, 223 can be formed, for example, by epitaxially depositing an in-situ doped semiconductor material (e.g., in situ doped silicon). For example, the N-type VFET region can be masked, epitaxial P+ silicon can be grown on the tops of the semiconductor fins 211 for the P-type VFETs 210, and the mask over the P-type VFET region can then be removed. Additionally, a mask can be formed over the P-type VFET region, epitaxial N+ silicon can be grown on the tops of the semiconductor fins 221 for the N-type VFETs 220, and the mask over the P-type VFET region can then be removed. These upper source/drain regions 213, 223 can be formed so that the top surfaces of the upper source/drain regions 213, 223 are some distance below the top surfaces of the source/drain sidewall spacers 244. Next, a cap material can be deposited and planarized (e.g., using a CMP process) to form discrete cap layers 245 on each upper source/drain region 213, 223 and laterally surrounded by a source/drain sidewall spacer 244. The cap layers 245 can be made of the second dielectric material (e.g., silicon nitride). Alternatively, the cap layers 245 can be made of any other suitable dielectric material that is different from the first dielectric material (e.g., silicon dioxide) and the dielectric material of the spacer layer 202.

Figure 11A:
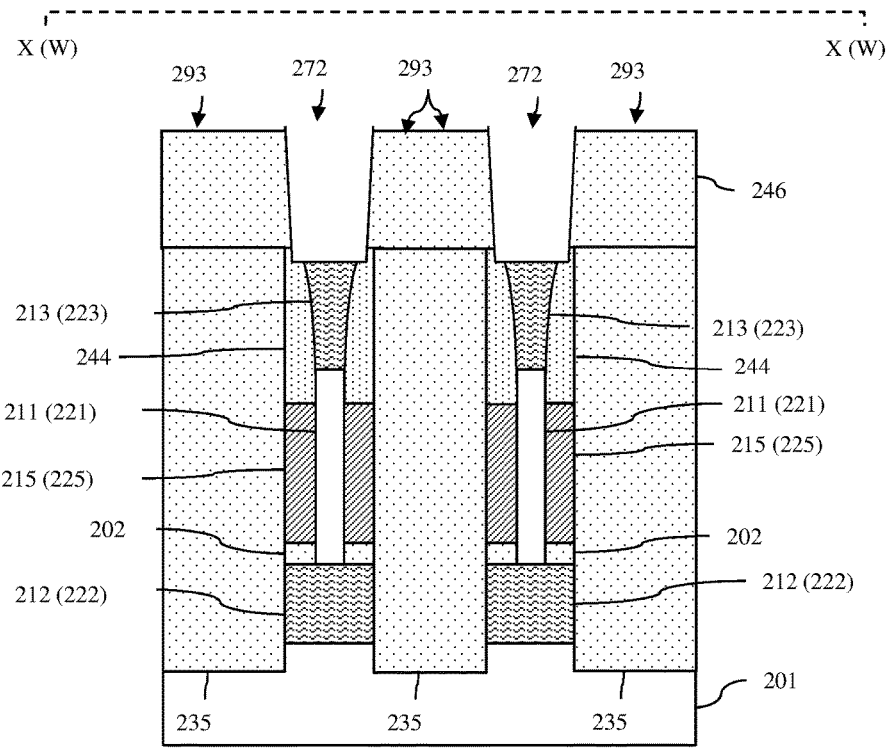
FIGS. 11A and 11B are different cross section diagrams of a partially completed structure formed according to the flow diagram of FIG. 1.
Figure 11B:
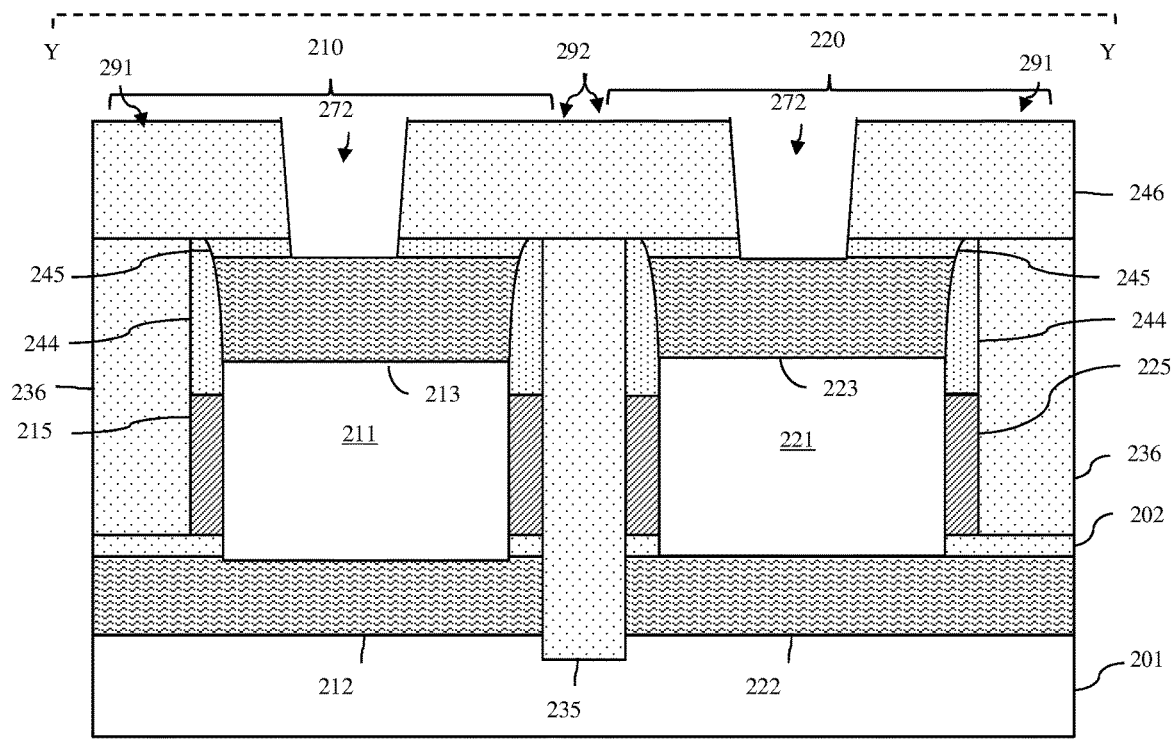

A dielectric layer 246 can then be deposited over the partially completed semiconductor structure and, particularly, over exposed top surfaces of the additional isolation regions 236 at the first ends 291 of the VFETs 210, 220, over the cap layers 244 on the VFETs 210, 220 and over the isolation regions 235 at the opposing sides 293 and second ends 292 of the VFETs 210, 220 (see process 135 and FIGS. 11A-11B). The dielectric layer 246 can be made of the same first dielectric material (e.g., silicon dioxide) (i.e., the same dielectric material as the isolation regions 235, additional isolation regions 236, and optionally the spacer layer 202).

After the dielectric layer 246 is formed, contacts to the various VFET terminals can be formed (see process 136 and FIGS. 11A-14B). The contacts for each VFET 210, 220 can include, but are not limited to, a self-aligned gate contact 283, a lower source/drain contact 281 and an upper source/drain contact 282. To form such contacts 281-283, contact openings 271-273 for each of the contacts 281-283 can be formed.

Specifically, upper source/drain contact openings 272 can be formed such that they extend essentially vertically through the dielectric layer 246 and then through the cap layers 245 above the VFETs 210, 220 to the upper source/drain regions 213, 223 (see FIGS. 11A-11B). These upper source/drain contact openings 272 can be formed using conventional lithographic patterning and selective and anisotropic etch processes.

Figure 12A:
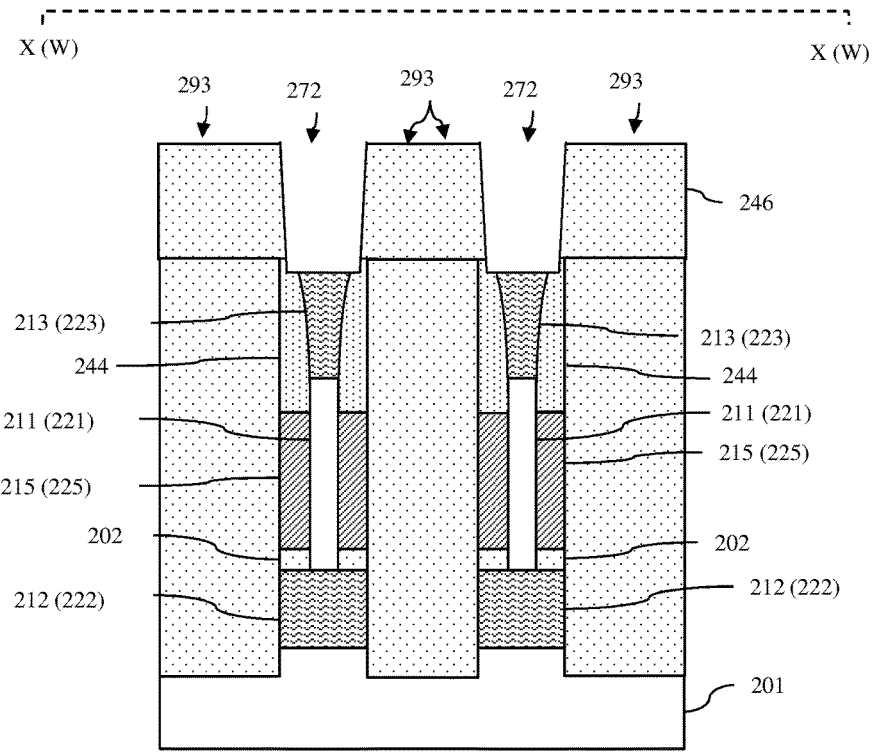
FIGS. 12A and 12B are different cross section diagrams of a partially completed structure formed according to the flow diagram of FIG. 1.
Figure 12B:
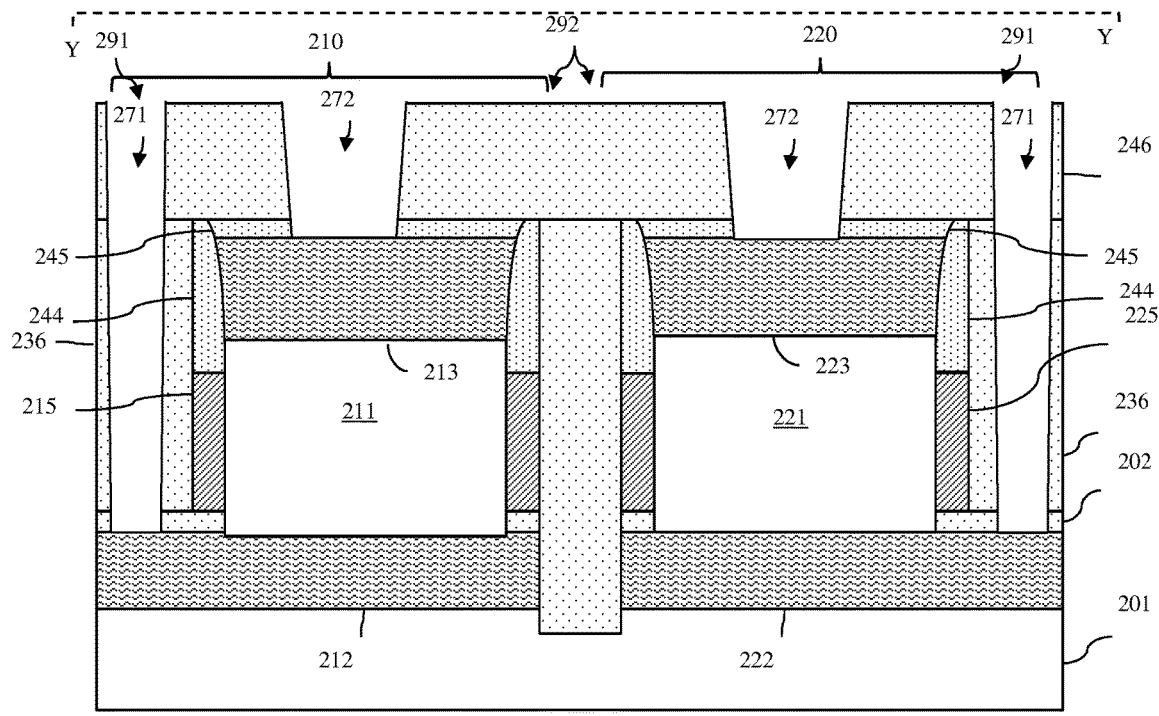
Figure 13A:
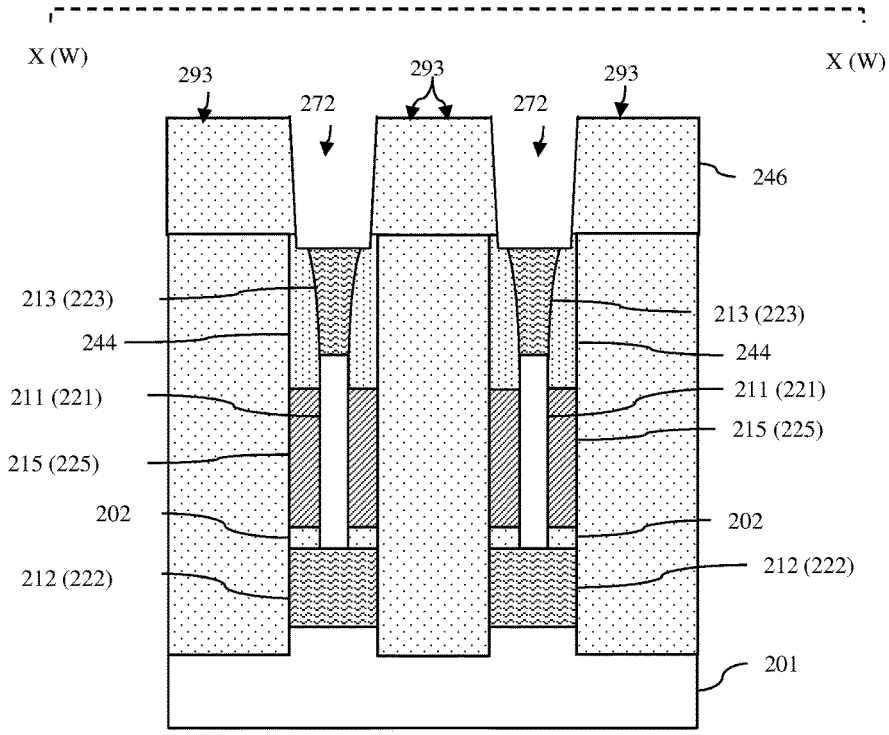
FIGS. 13A and 13B are different cross section diagrams of a partially completed structure formed according to the flow diagram of FIG. 1.
Figure 13B:
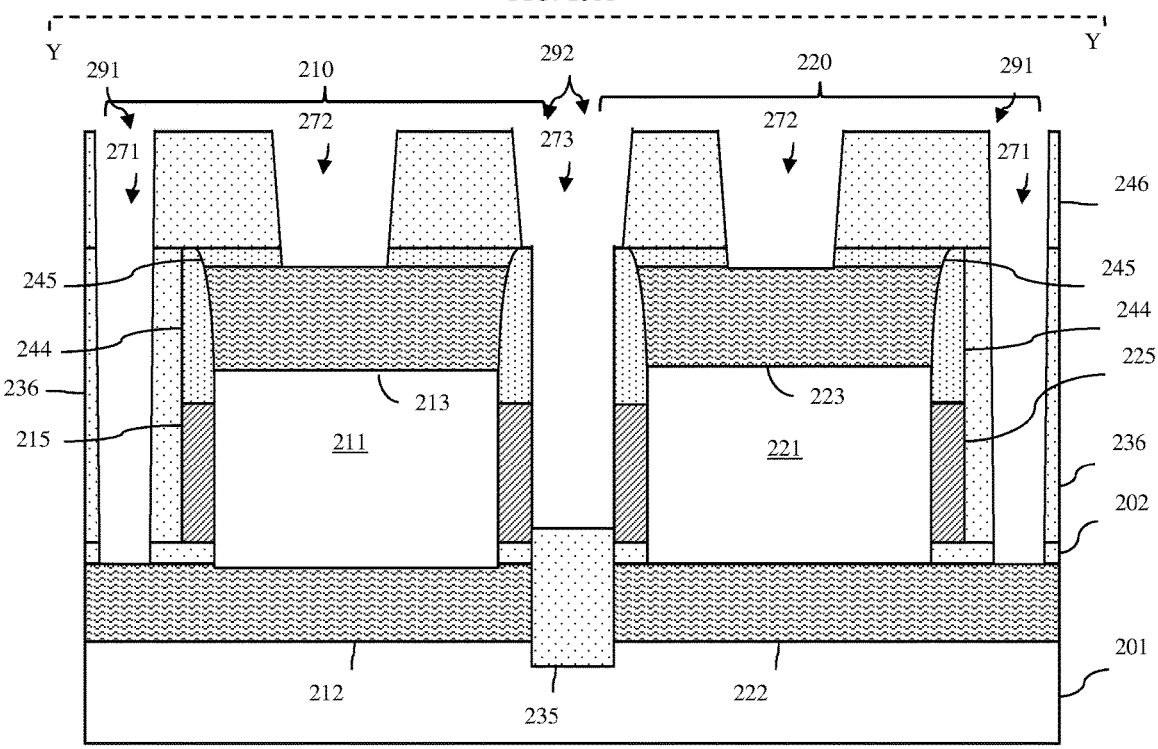

Lower source/drain contact openings 271 can be formed such that they are positioned at the first ends 291 of the VFETs 210, 220 and further such that each contact opening 271 extends essentially vertically through the dielectric layer 246, an additional isolation region 236, and the spacer layer 202 down to an outer edge portion of a lower source/drain region, which extends laterally beyond a gate at the first end of the VFET (see FIGS. 12A-12B). These lower source/drain contact openings 271 can be formed using conventional lithographic patterning and selective anisotropic etch processes. However, it should be noted that, in this method embodiment, if the lower source/drain contact openings 271 are patterned too close to the first ends 291 of the VFETs 210, 220 (e.g., if lithographic overlay errors occur) or if too much laterally etching of the first dielectric material (e.g., silicon dioxide) occurs during the etch process, the vertical surfaces of the gates 215, 225 could be exposed. Exposing the gates 215, 225 in the source/drain contact openings 271 will subsequently result in source/drain contact-to-gate shorts. Thus, care should be taken to ensure precise patterning and etch control.

Gate contact openings 273 can be formed such that they are positioned at the second ends 292 of the VFET 210, 220, such that they extend vertically through the dielectric layer 246 and into the isolation region 235 and further such that they expose vertical surfaces of the gates 215, 225 and have bottoms that are above the level of the top surface of the spacer layer 202. As illustrated, a single gate opening 273 can, optionally, expose vertical surfaces of two adjacent gates 215, 225. In any case, conventional lithographic patterning and selective anisotropic etch processes could be used. Furthermore, care should be taken to avoid exposing the upper source/drain regions 213, 223 within the gate contact openings. Exposing the upper source/drain regions 213, 223 in the gate contact openings 273 will subsequently result in source/drain-to-gate contact shorts. However, in this case, the etch process used during gate contact formation will be performed in a self-aligned manner. That is, an anisotropic etch process that is selective for the first dielectric material (e.g., silicon dioxide) of the dielectric layer 246 and the isolation region 235 over other dielectric materials can be performed and, during this etch process, the cap layers 245 and the source/drain sidewall spacers 244, which are made of dielectric materials that are different from the first dielectric material, will protect the upper source/drain regions 213, 223 from exposure. As mentioned above, the cap layers 245 and the source/drain sidewall spacers 244 could be made of the second dielectric material (e.g., silicon nitride) or any other suitable dielectric material that is different from the first dielectric material. As a result of the etch selectivities between the different dielectric materials exposed in that system, this process is more robust against process variabilities like lithographic overlay control, etc. It should be noted that these contact openings 271-273 can be formed in the order discussed above (i.e., upper source/drain contact openings, lower source/drain contact openings, and then gate contact) or in any other suitable.

Once the contact openings 271-273 are formed, one or more conductors can be deposited to fill the contact openings 271-273, thereby forming lower source/drain contacts 281, upper source/drain contacts 282, and self-aligned gate contacts 283 for each of the VFETs 210, 220. The conductor(s) used to form the contacts 281-283 can be, for example, copper, tungsten, aluminum, cobalt, or any other metal material that is suitable for middle of the line (MOL) contact formation. Techniques for depositing various metal materials to fill contact openings are well known in the art and, thus, the techniques are omitted from this specification in order to allow the reader to focus on the salient aspects of the disclosed methods. As illustrated and discussed above, a single gate opening 273 can, optionally, expose vertical surfaces of two adjacent gates 215, 225 and, thus, a single self-aligned gate contact 283 can contact adjacent gates 215, 225.

As mentioned above, the method embodiments disclosed in FIGS. 1 and 15 are slightly different following process 110.

Referring specifically to the flow diagram of FIG. 15, the processes 101-110 are performed as described above and illustrated in FIGS. 2A-6B. In this method embodiment, before the masks 242 are removed, the first dielectric material (e.g., silicon dioxide) can be deposited and planarized (e.g., using a CMP process) so as to expose the top surfaces of the sacrificial fin caps 203 and sacrificial sidewall spacers 204 (see process 125 and FIGS. 16A-16B). The masks 242 can then be selectively removed (see process 126 and FIGS. 17A-17B). As a result of processes 110 and 125-126 of FIG. 15, isolation regions 235 are formed at the second end 292 and at the opposing sides 293 of each of the VFETs 210, 220. Specifically, these isolation regions 235 have lower portions, which are within the semiconductor substrate 201 and electrically isolate adjacent lower source/drain regions 212, 222. These isolation regions 235 further extend upward through the spacer layer 202 and are positioned laterally immediately adjacent to the gates 215, 225 of each VFET at the opposing sides 293 and the second ends 292. Additionally, as a result of processes 110 and 121-122, the top surface of the spacer layer 202 and vertical surfaces of the gates 215, 225 and the sacrificial sidewall spacers 204 thereon are exposed at the first ends 291 of the VFETs 210, 220 following isolation region formation.

Figure 18A:
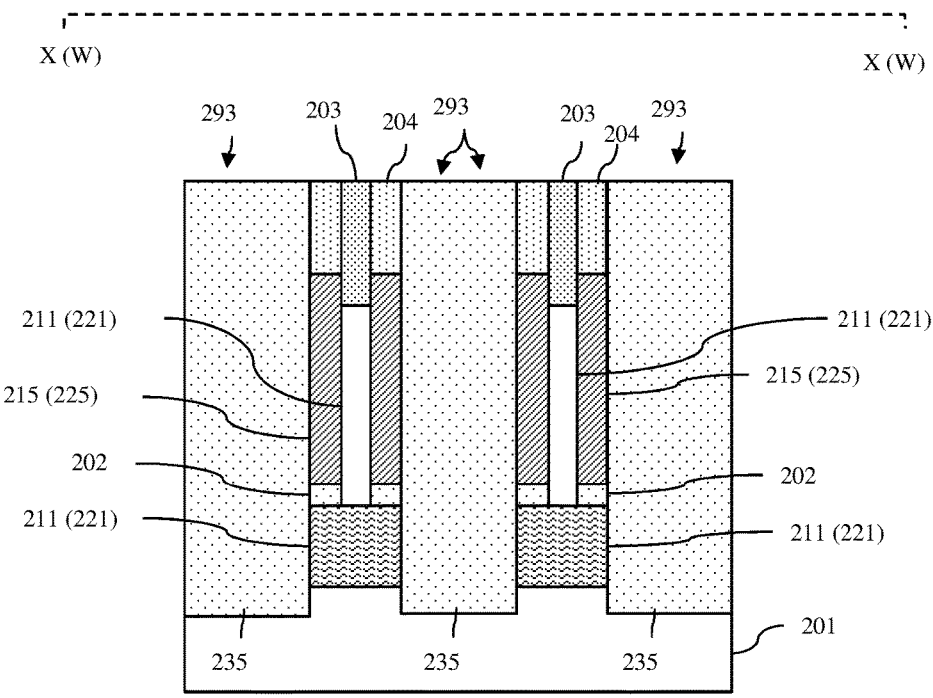
FIGS. 18A and 18B are different cross section diagrams of a partially completed structure formed according to the flow diagram of FIG. 15.
Figure 18B:
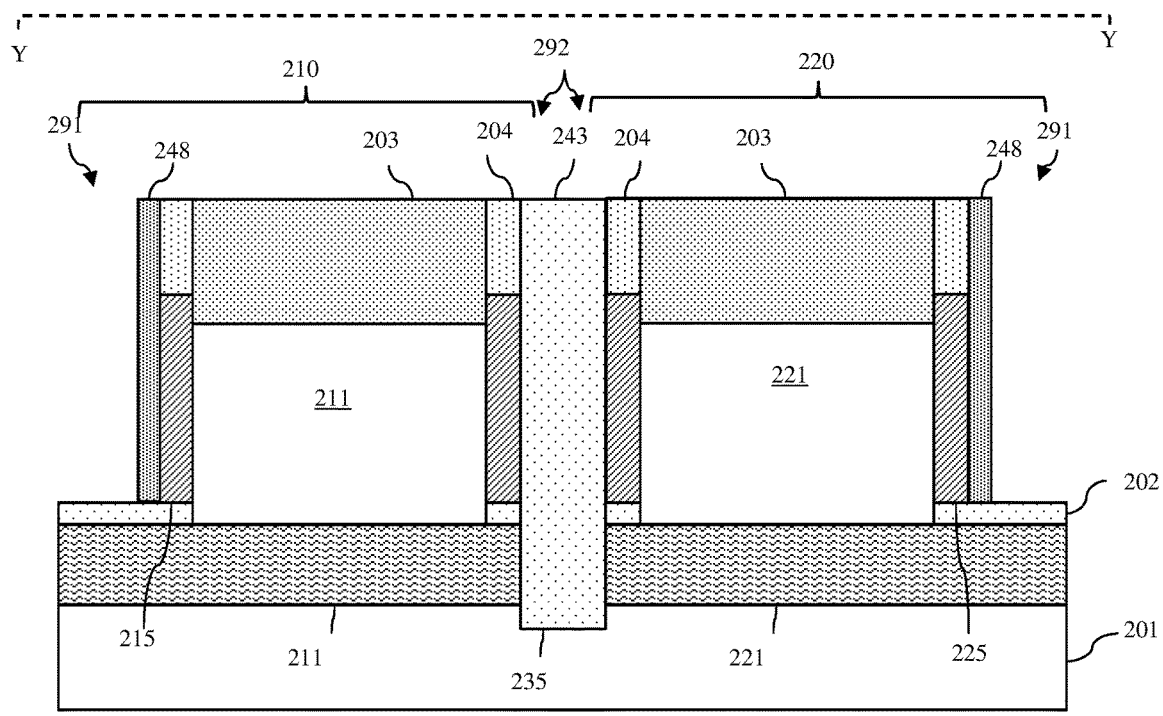

Next, gate sidewall spacers 248 can be formed above the spacer layer 202 and positioned laterally adjacent to exposed vertical surfaces of the gates 215, 225 and sacrificial sidewall spacers 204 thereon at the first ends 291 of the VFETs 210, 220 (see process 127 and FIGS. 18A-18B). Conventional sidewall spacer formation techniques can be used to form the gate sidewall spacers 248. That is, a gate sidewall spacer layer can be conformally deposited over the partially completed structure and then an anisotropic etch process can be performed to remove the sidewall spacer material from horizontal surfaces. The gate sidewall spacers 248 can be made of the second dielectric material (e.g., silicon nitride). Alternatively, the source/drain sidewall spacers 248 can be made of any other suitable dielectric material that is different from the first dielectric material (e.g., silicon dioxide) and different from the dielectric material of the spacer layer 202 (e.g., if the spacer layer 202 is a low-K dielectric material).

Figure 19A:
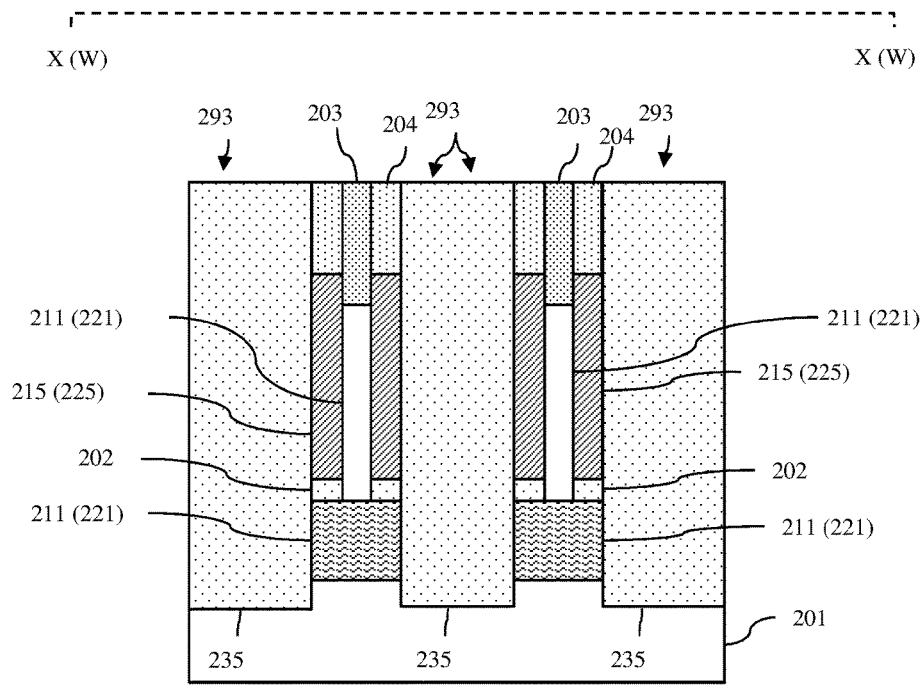
FIGS. 19A and 19B are different cross section diagrams of a partially completed structure formed according to the flow diagram of FIG. 15.
Figure 19B:
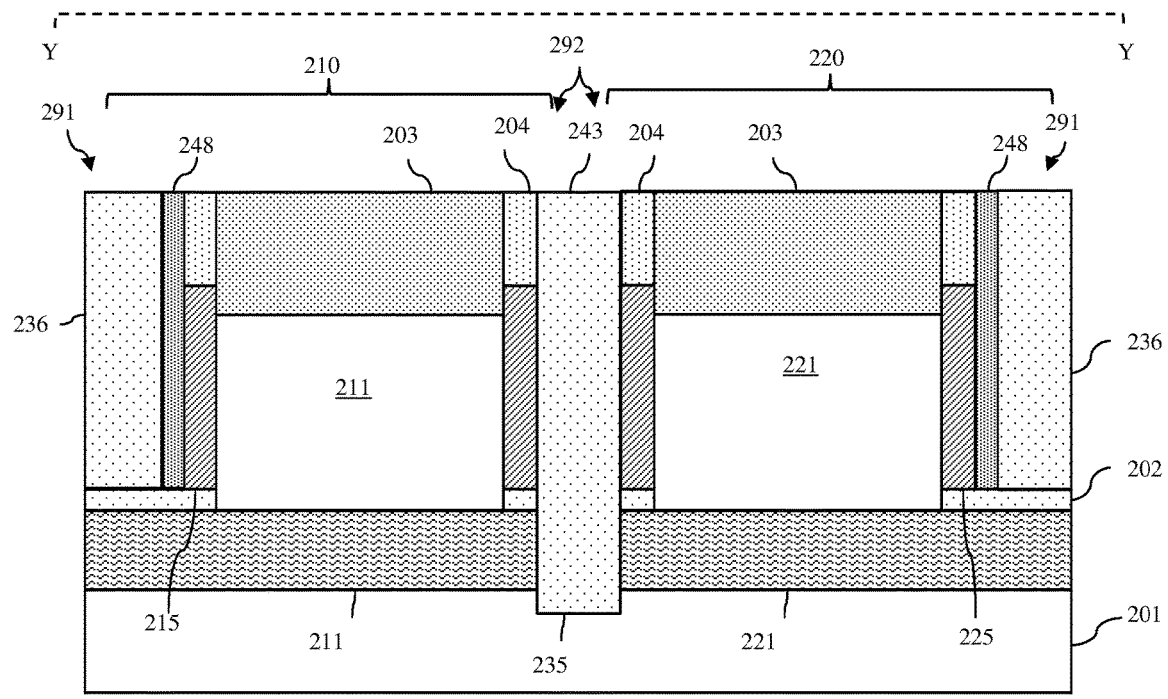
Figure 20A:
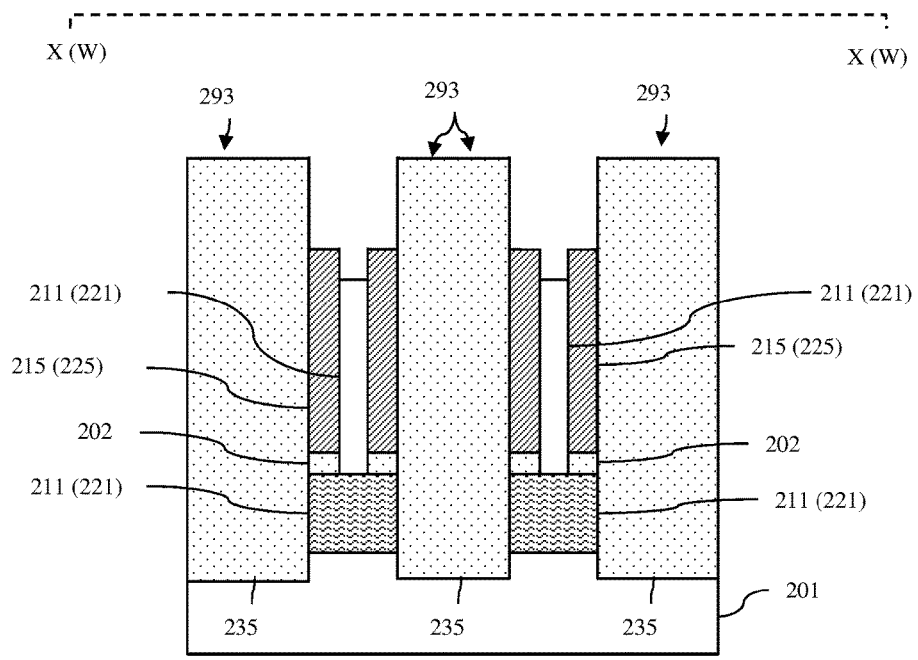
FIGS. 20A and 20B are different cross section diagrams of a partially completed structure formed according to the flow diagram of FIG. 15.
Figure 20B:
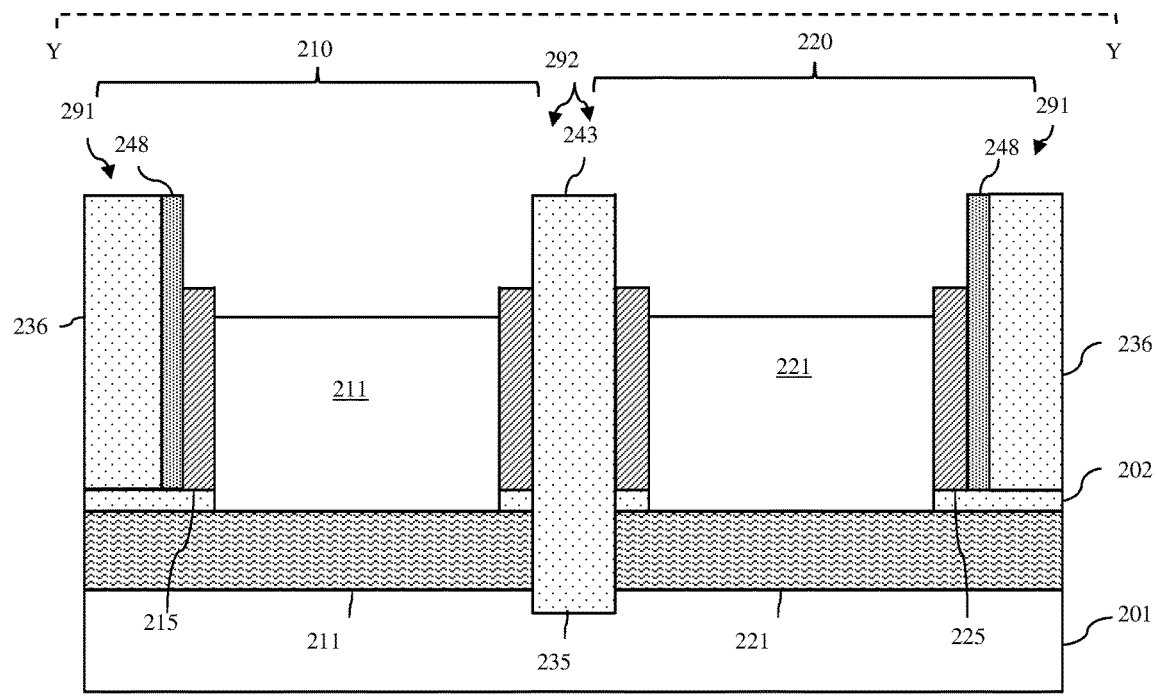
Figure 21A:
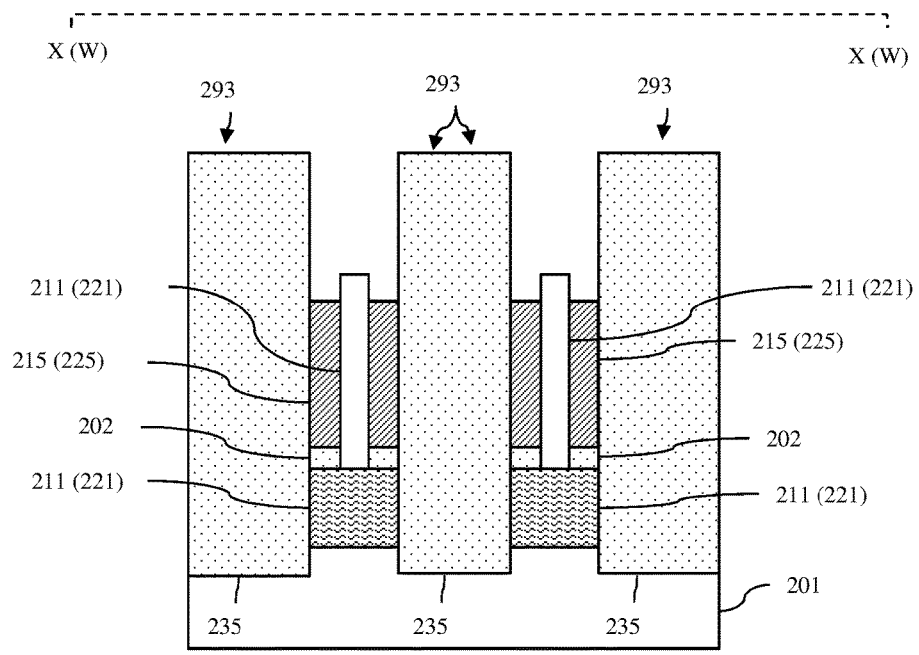
FIGS. 21A and 21B are different cross section diagrams of a partially completed structure formed according to the flow diagram of FIG. 15.
Figure 21B:
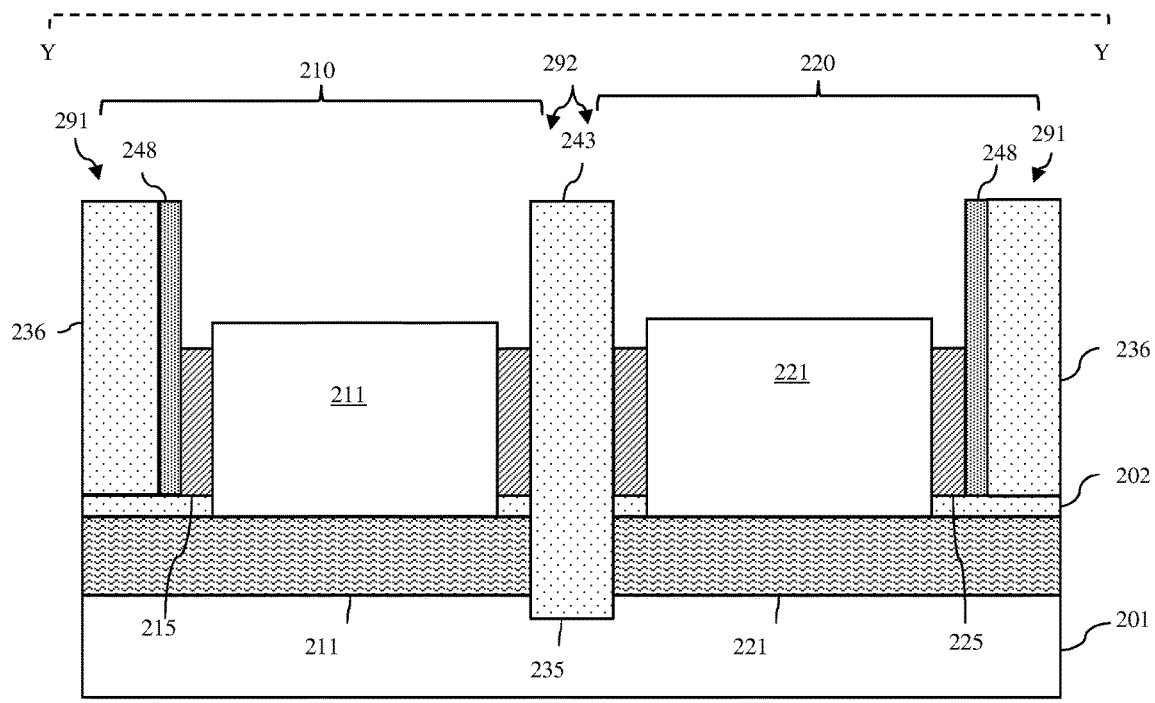

After the gate sidewall spacers 248 are formed, the first dielectric material (e.g., silicon dioxide) can be redeposited and planarized (e.g., using a CMP process) to expose the top surfaces of the sacrificial fin caps 203 and the sacrificial sidewall spacers 204, thereby forming additional isolation regions 236 at the first ends 291 of the VFETs 210, 220 (see process 128 and FIGS. 19A-19B).

Additional processes 131-136 can then be performed in order to complete each of the VFETs 210, 220 and these processes will be essentially the same as those processes described above with respect to the flow diagram of FIG. 1 except that the lower source/drain contact will also be self-aligned.

Figure 8A:
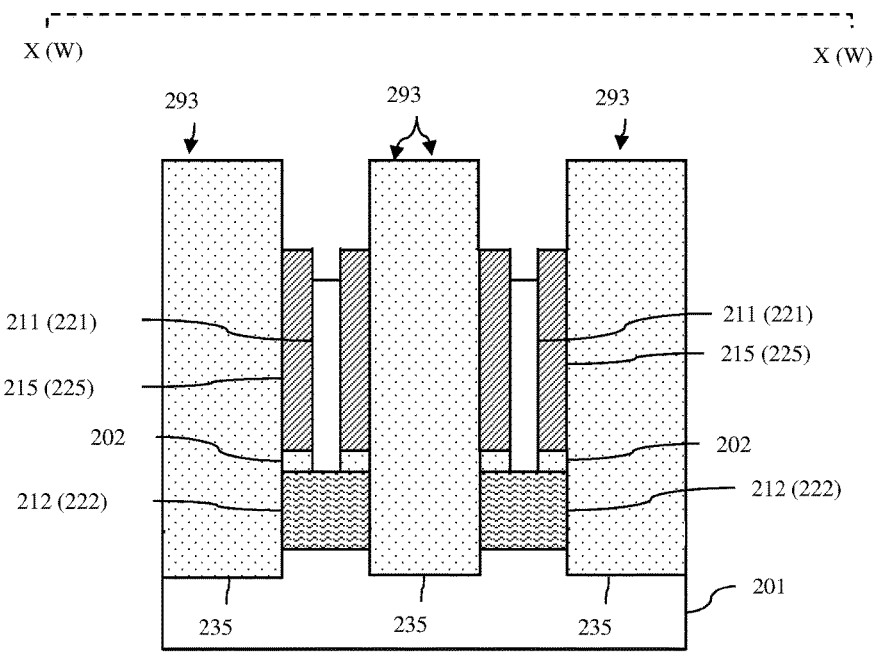
FIGS. 8A and 8B are different cross section diagrams of a partially completed structure formed according to the flow diagram of FIG. 1.
Figure 8B:
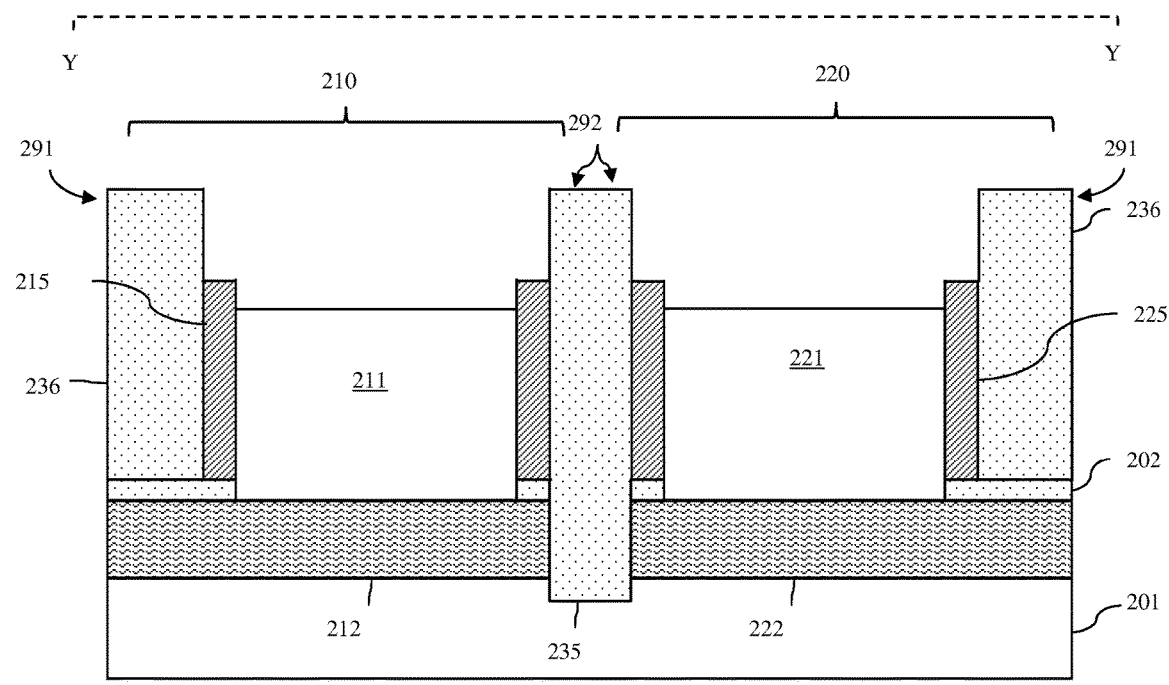
Figure 9A:
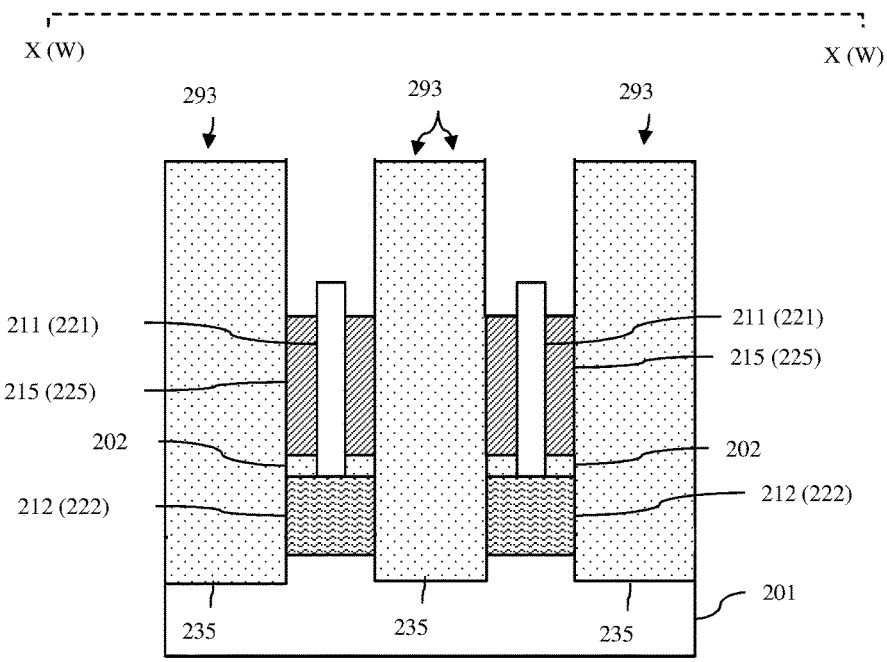
FIGS. 9A and 9B are different cross section diagrams of a partially completed structure formed according to the flow diagram of FIG. 1.
Figure 9B:
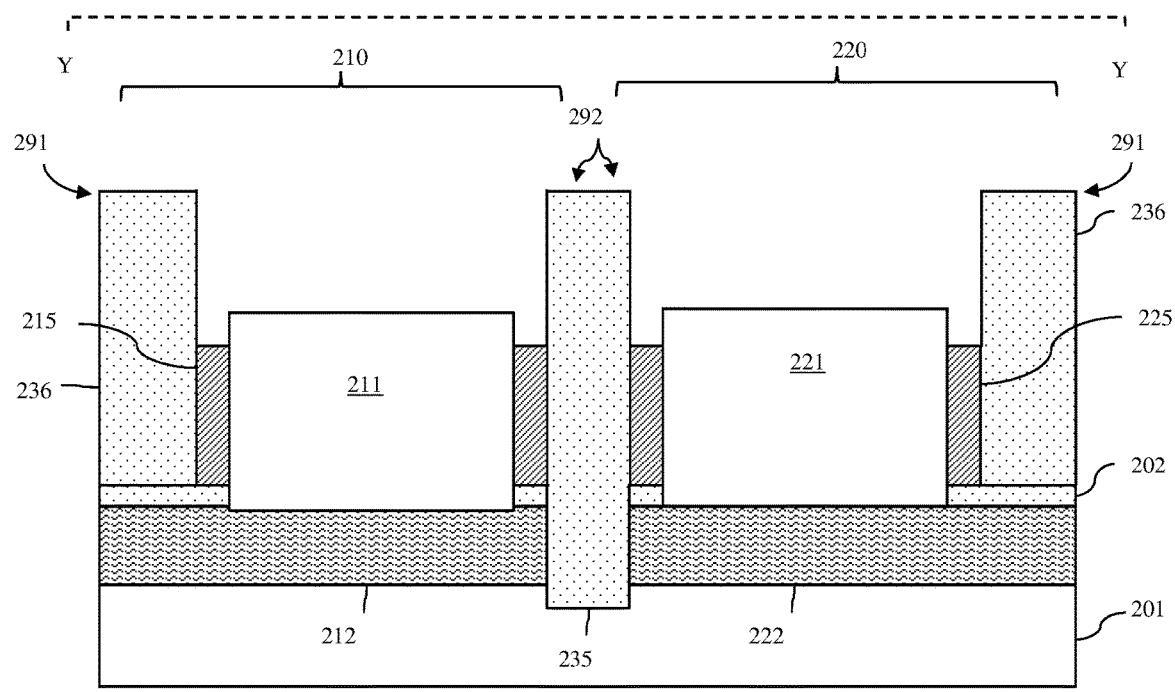

Specifically, the sacrificial fin caps 203 and sacrificial sidewall spacers 204 can be selectively removed (e.g., using a selective reactive ion etch (RIE) process) (see process 131 and FIGS. 8A-8B). The gates 215, 225 of the VFETs 210, 220 can then be etched back so that the top surface of each gate 215, 225 is below the level of the top surface of the adjacent semiconductor fin 211, 221 (see process 132 and FIGS. 20A-20B). Etching back of the gates 215, 225 can be performed using, for example, a selective isotropic etch process to ensure that the heights of the gates 215, 225 (which will correspond to the gate lengths) will be essentially uniform (i.e., the same across the semiconductor structure). Once the gates 215, 225 are etched back, source/drain sidewall spacers 244 can be formed above those gates 215, 225 and positioned laterally immediately adjacent to the exposed vertical surfaces of the adjacent isolation regions 235 and gate sidewall spacers 248 (see process 133 and FIGS. 21A-21B). Conventional sidewall spacer formation techniques can be used to form the source/drain sidewall spacers 244. That is, a source/drain sidewall spacer layer can be conformally deposited over the partially completed structure, followed by an anisotropic etch process to remove the sidewall spacer material from horizontal surfaces. The source/drain sidewall spacers 244 can be made of the second dielectric material (e.g., silicon nitride). Alternatively, the source/drain sidewall spacers 244 can be made of any other suitable dielectric material that is different from the first dielectric material (e.g., silicon dioxide).

Figure 22A:
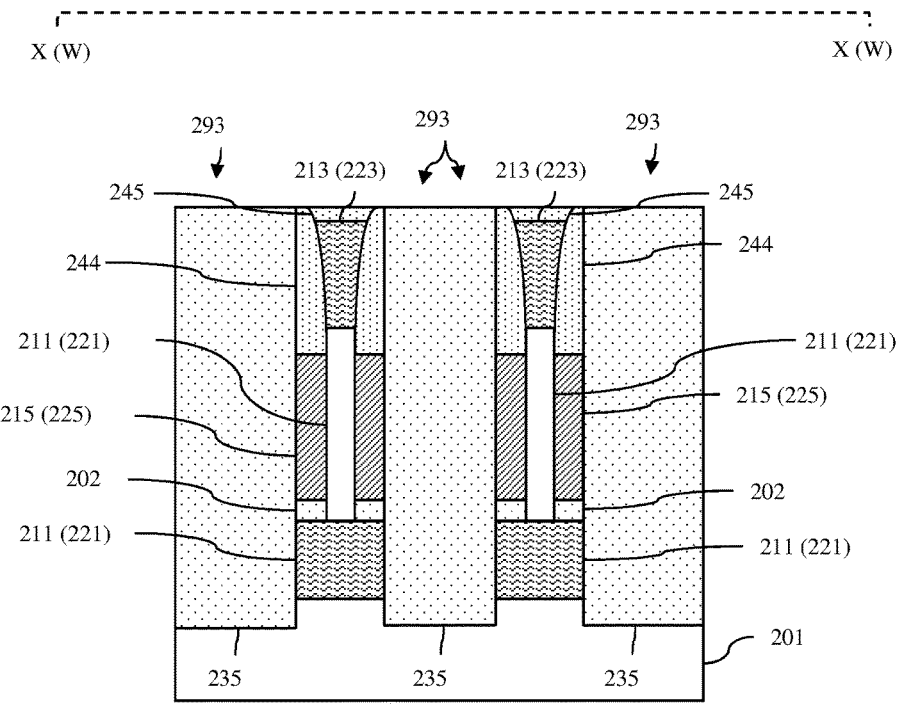
FIGS. 22A and 22B are different cross section diagrams of a partially completed structure formed according to the flow diagram of FIG. 15.
Figure 22B:
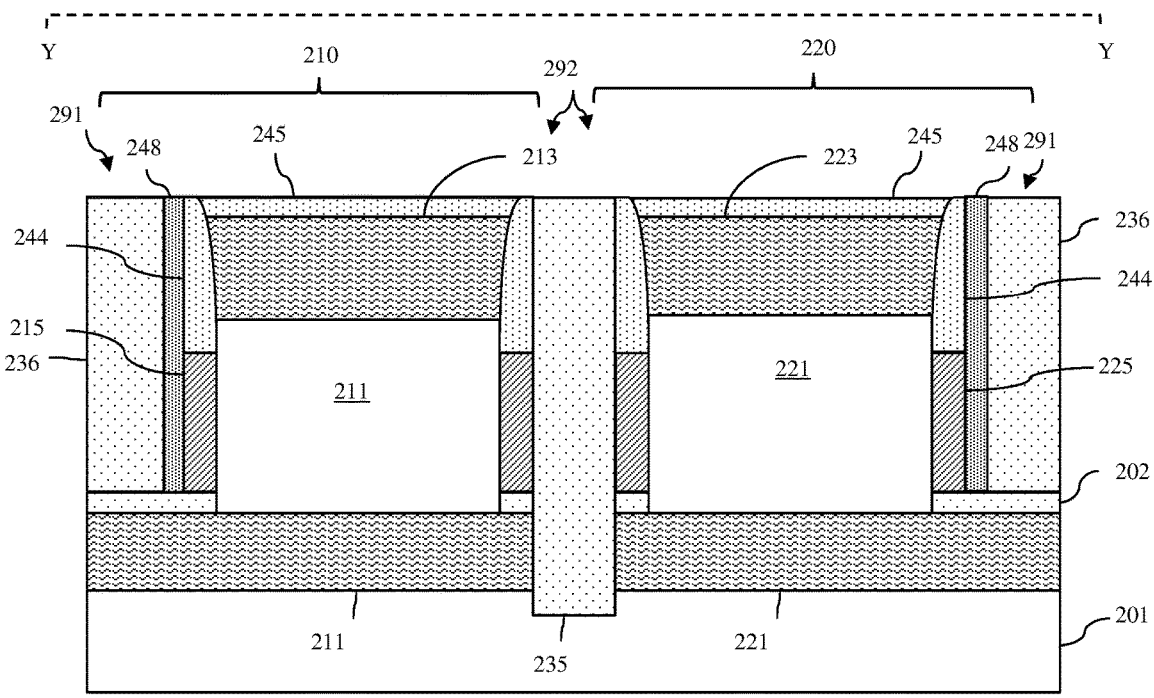

Upper source/drain regions 213, 223 can then be formed on the tops of the semiconductor fins 211, 221 so as to be laterally surrounded by the source/drain spacers 244 (see process 134 and FIGS. 22A-22B). The upper source/drain regions 213, 223 can be formed, for example, by epitaxially depositing an in-situ doped semiconductor material (e.g., in situ doped silicon). For example, the second-type VFET region can be masked, epitaxial P+ silicon can be grown on the tops of the semiconductor fins 211 for the P-type VFETs 210, and the mask over the second-type VFET region can then be removed. Additionally, a mask can be formed over the first-type VFET region, epitaxial N+ silicon can be grown on the tops of the semiconductor fins 221 for the N-type VFETs 220, and the mask over the first-type VFET region can then be removed. In any case, these upper source/drain regions 213, 223 can be grown to a height below the height of the source/drain sidewall spacers 244 or can be recessed so as to have a height below the height of the source/drain sidewall spacers. Next, a cap material can be deposited and planarized to form discrete cap layers 245 on each upper source/drain region 213, 223 and laterally surrounded by a source/drain sidewall spacer 244. The cap layers 245 can be made of the second dielectric material (e.g., silicon nitride). Alternatively, the cap layers 245 can be made of any other suitable dielectric material that is different from the first dielectric material (e.g., silicon dioxide).

Figure 23A:
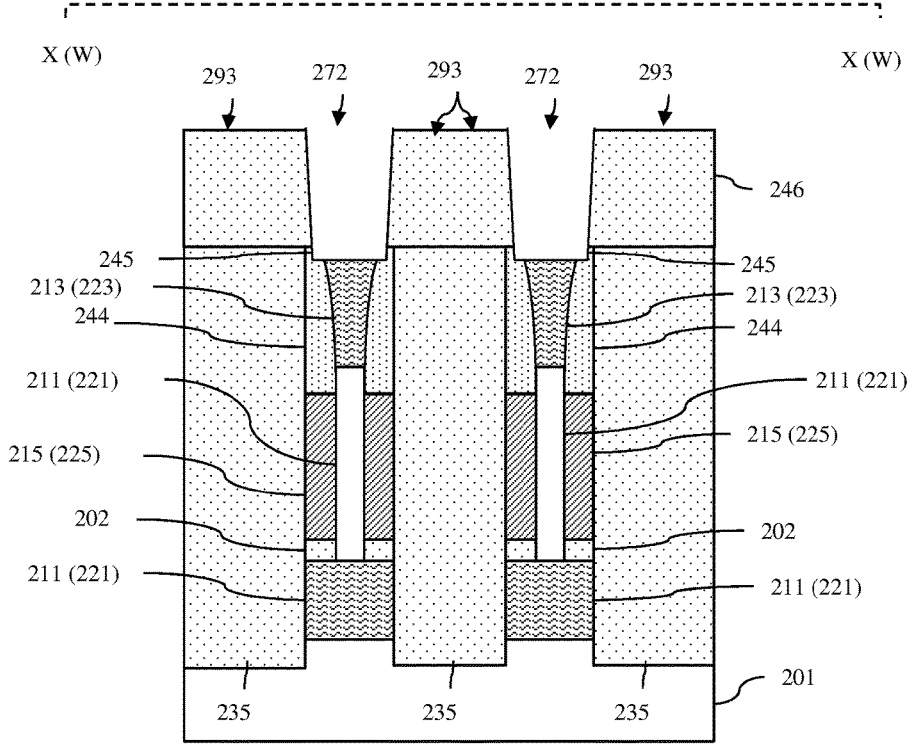
FIGS. 23A and 23B are different cross section diagrams of a partially completed structure formed according to the flow diagram of FIG. 15.
Figure 23B:
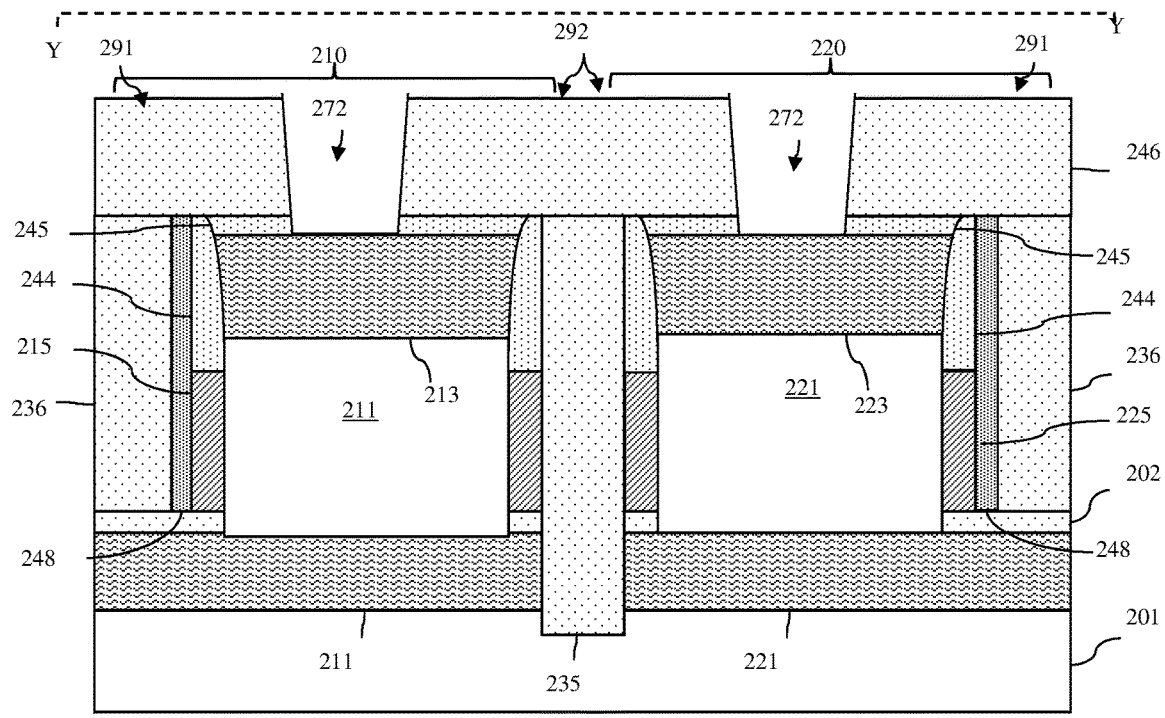

A dielectric layer 246 can then be deposited over the partially completed semiconductor structure and, particularly, over exposed top surfaces of the additional isolation regions 236 at the first ends 291 of the VFETs 210, 220, over the cap layers 244 on the VFETs 210, 220 and over the isolation regions 235 at the opposing sides 293 and second ends 292 of the VFETs 210, 220 (see process 135 and FIGS. 23A-23B). The dielectric layer 246 can be made of the same first dielectric material (e.g., silicon dioxide) used for the isolation regions 235, additional isolation regions 236 and, optionally, the spacer layer 202. After the dielectric layer 246 is formed, contacts to the various VFET terminals can be formed (see process 136 and FIGS. 24A to 26B). The contacts for each VFET 210, 220 in this embodiment can include, but are not limited to, a self-aligned gate contact 283, a self-aligned lower source/drain contact 281' and an upper source/drain contact 282'. To form such contacts 281-283, contact openings 271'-273 for each of the contacts 281'-283 can be formed.

Specifically, upper source/drain contact openings 272 can be formed such that they extend essentially vertically through the dielectric layer 246 and then through the cap layers 245 above the VFETs 210, 220 to the upper source/drain regions 213, 223 (see FIGS. 23A-23B). These upper source/drain contact openings 272 can be formed using conventional lithographic patterning and selective and anisotropic etch processes.

Figure 24A:
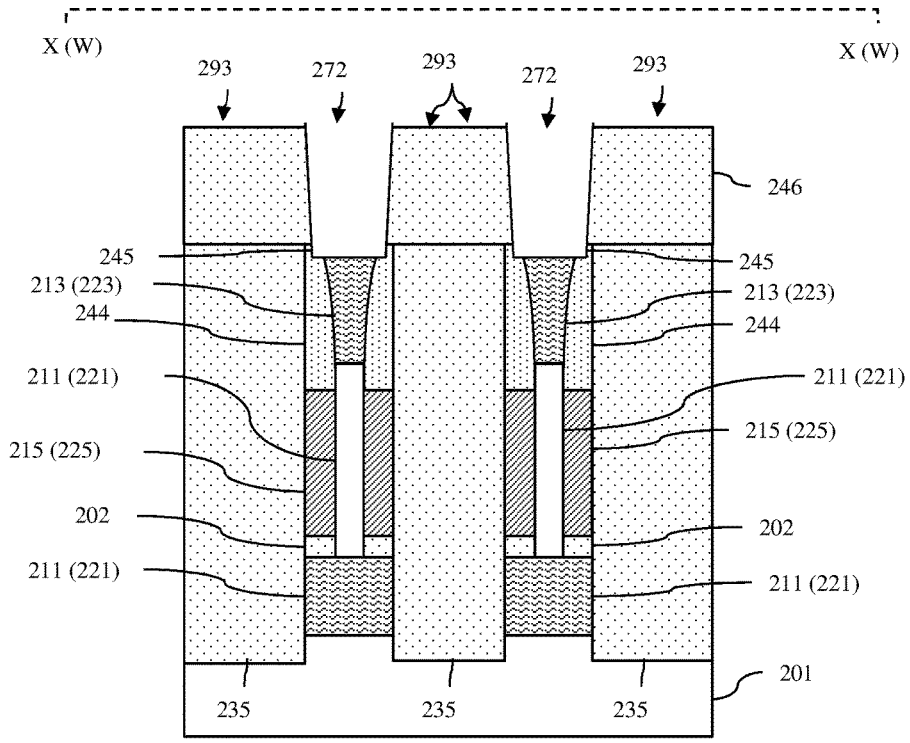
FIGS. 24A and 24B are different cross section diagrams of a partially completed structure formed according to the flow diagram of FIG. 15.
Figure 24B:
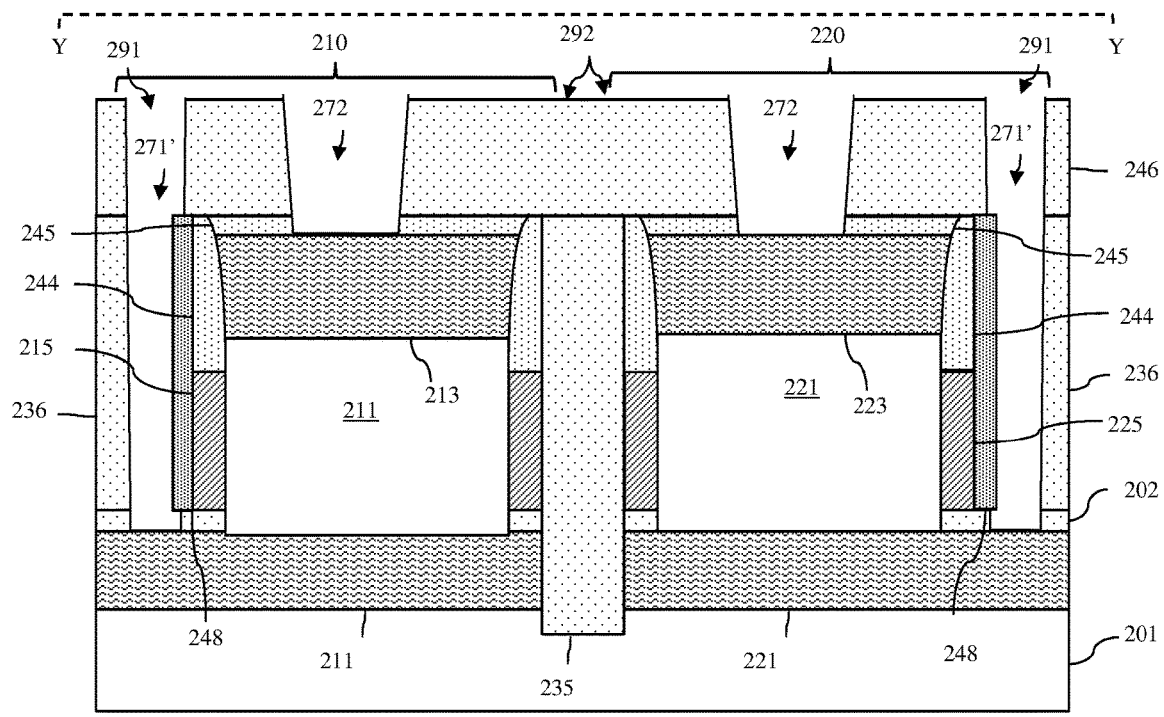

Lower source/drain contact openings 271' can be formed such that the lower source/drain contacts are positioned at the first ends 291 of the VFETs 210, 220 and further such that each lower source/drain contact 271' extends essentially vertically through the dielectric layer 246, an additional isolation region 236, and the spacer layer 202 down to an outer edge portion of a lower source/drain regions, which extends laterally beyond a gate (see FIGS. 24A-24B). These lower source/drain contact openings 271' can similarly be formed using conventional lithographic patterning and selective anisotropic etch processes. However, it should be noted that, in this method embodiment, the lower source/drain contact openings 271' are formed in a self-align manner. That is, an anisotropic etch process that is selective for the first dielectric material (e.g., silicon dioxide) of the dielectric layer 246, additional isolation region 236 and the spacer layer 202 is performed and, during this etch process, the gate sidewall spacers 248, the cap layers 245 and the source/drain sidewall spacers 244, which are made of dielectric materials that are different from the first dielectric material, will protect the gates 215, 225 and the upper source/drain regions 213, 223 from exposure. As mentioned above, the gate sidewall spacers 244, cap layers 245 and the source/drain sidewall spacers 244 could be made of the second dielectric material (e.g., silicon nitride) or any other suitable dielectric material that is different from the first dielectric material. As a result of the etch selectivities between the different dielectric materials exposed in that system, this process is more robust against process variabilities like lithographic overlay control, etc.

Figure 25A:
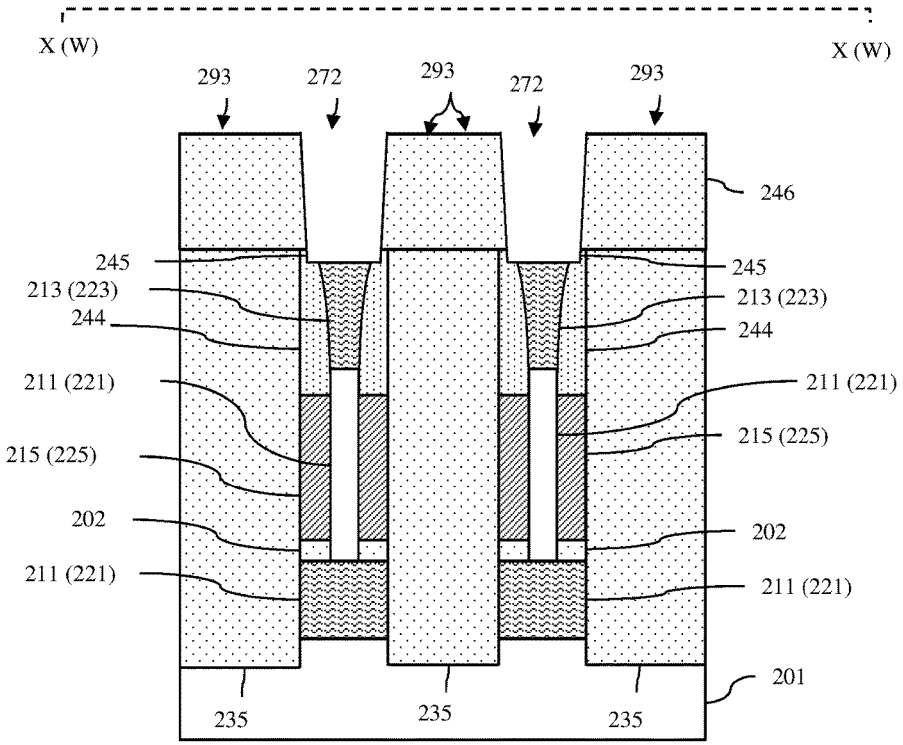
FIGS. 25A and 25B are different cross section diagrams of a partially completed structure formed according to the flow diagram of FIG. 15.
Figure 25B:
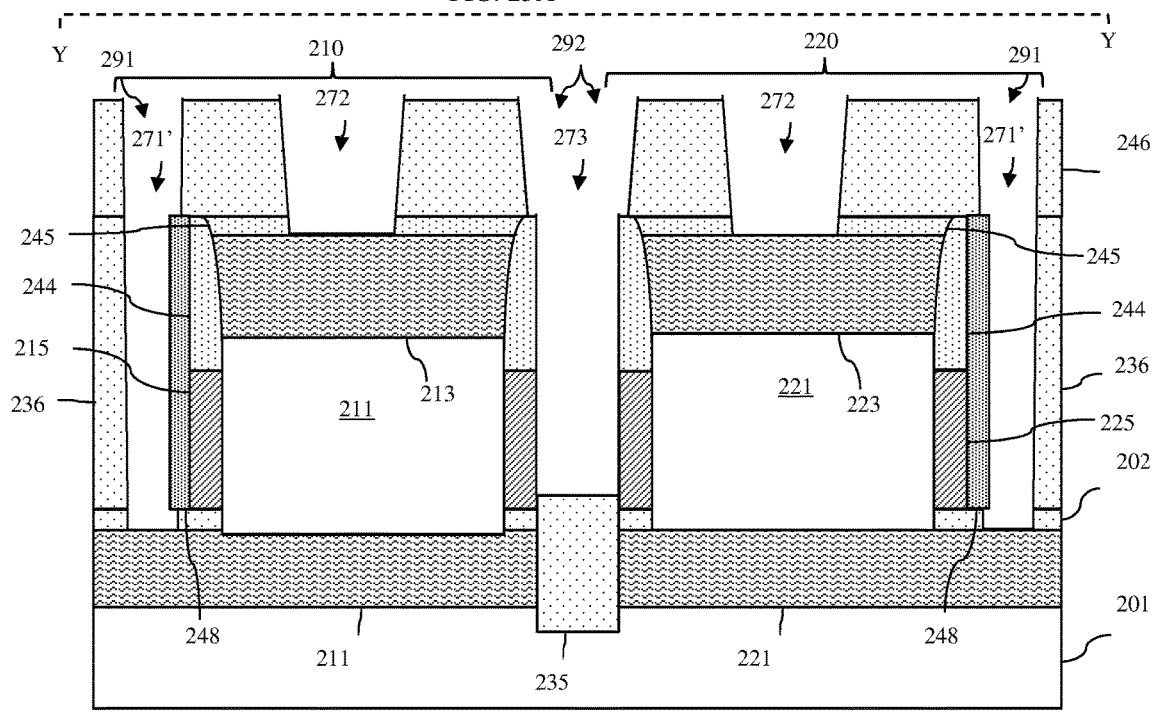

Gate contact openings 273 can be formed such that they are positioned at the second ends 292 of the VFET 210, 220, such that they extend vertically through the dielectric layer 246 and into the isolation region 235 both of which are made of the first dielectric material (e.g., silicon dioxide), and further such that they expose vertical surfaces of the gates 215, 225 and have bottoms that are above the level of the top surface of the spacer layer 202 (see FIGS. 25A-25B). As illustrated, a single gate opening 273 can, optionally, expose vertical surfaces of two adjacent gates 215, 225. In any case, conventional lithographic patterning and selective anisotropic etch processes could be used. Furthermore, care should be taken to avoid exposing the upper source/drain regions 213, 223 within the gate contact openings. Exposing the upper source/drain regions 213, 223 in the gate contact openings 273 will subsequently result in source/drain-to-gate contact shorts. However, in this case, the etch process used during gate contact formation will be performed in a self-aligned manner. That is, an anisotropic etch process that is selective for the first dielectric material (e.g., silicon dioxide) of the dielectric layer 246 and the isolation region 235 over other dielectric materials can be performed and, during this etch process, the cap layers 245 and the source/ drain sidewall spacers 244, which are made of dielectric materials that are different from the first dielectric material, will protect the upper source/drain regions 213, 223 from exposure. As mentioned above, the cap layers 245 and the source/drain sidewall spacers 244 could be made of the second dielectric material (e.g., silicon nitride) or any other suitable dielectric material that is different from the first dielectric material. As a result of the etch selectivities between the different dielectric materials exposed in that system, this process is more robust against process variabilities like lithographic overlay control, etc. It should be noted that these contact openings 271'-273 can be formed in the order discussed above (i.e., upper source/drain contact openings, lower source/drain contact openings, and then gate contact) or in any other suitable.

Figure 26A:
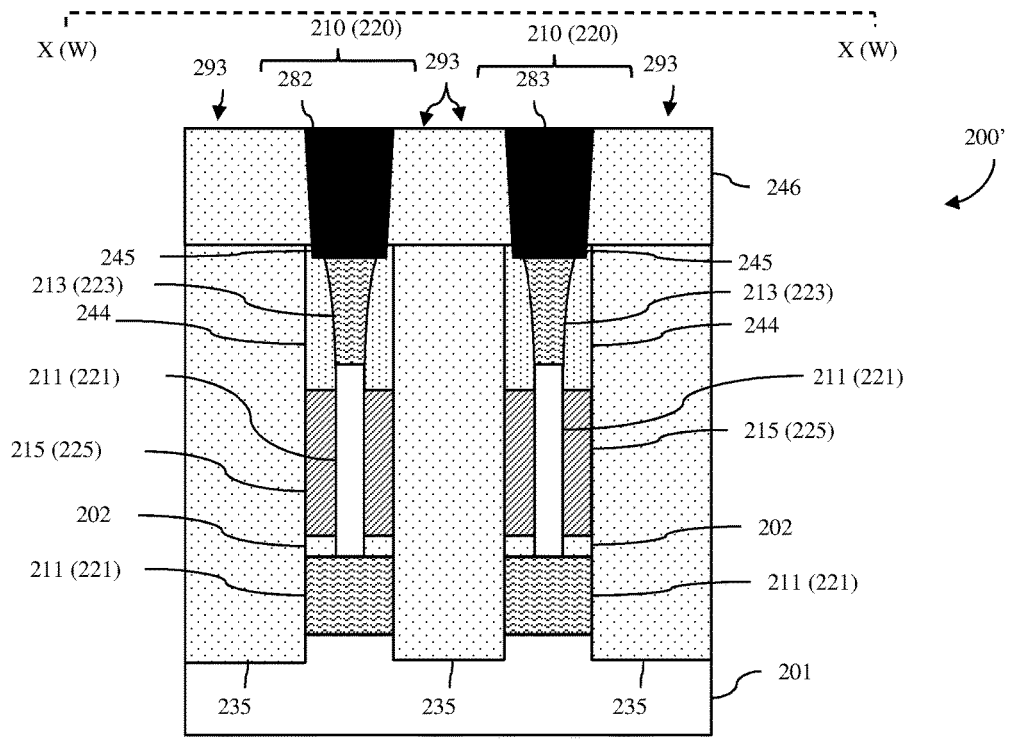
FIGS. 26A and 26B are different cross section diagrams of a structure formed according to the flow diagram of FIG. 15.
Figure 26B:
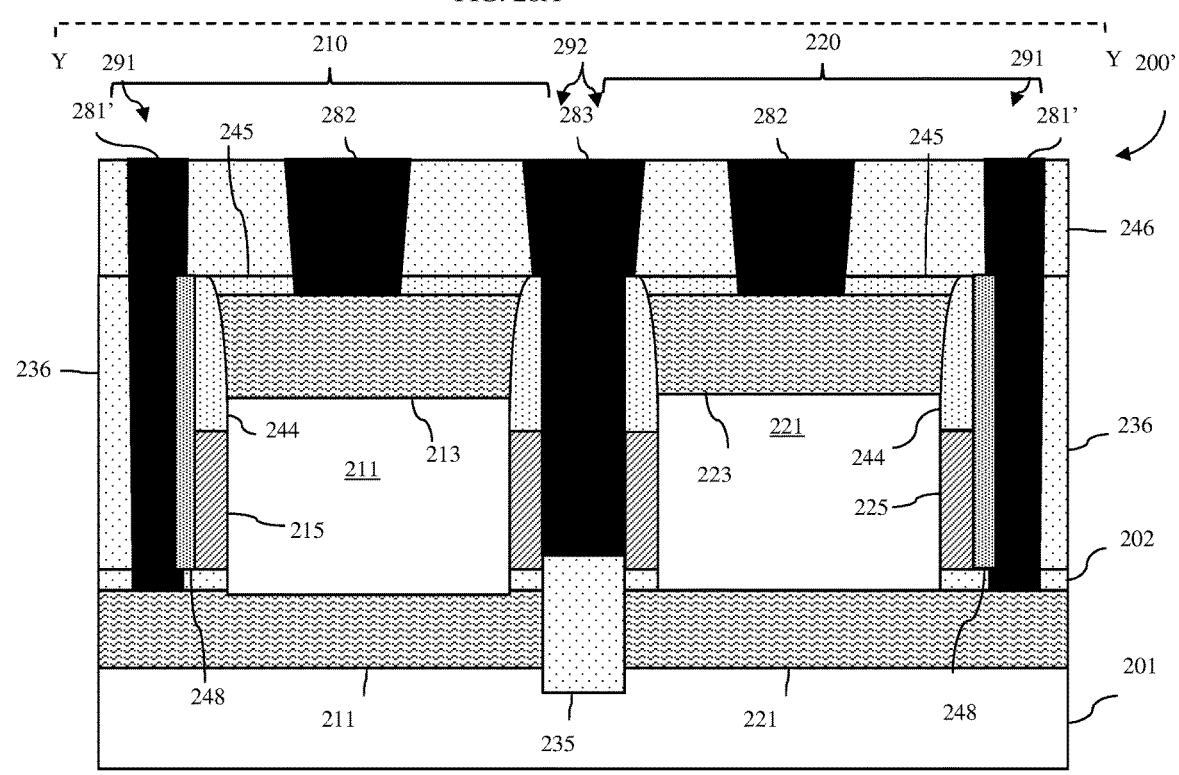

Once the contact openings 271'-273 are formed, one or more conductors can be deposited to fill the contact openings 271-273, thereby forming self-aligned lower source/drain contacts 281, upper source/drain contacts 282, and self-aligned gate contacts 283 for each of the VFETs 210, 220 (see FIGS. 26A-26B). The conductor(s) used to form the contacts 281-283 can be, for example, copper, tungsten, aluminum, cobalt, or any other metal material that is suitable for middle of the line (MOL) contact formation. Techniques for depositing various metal materials to fill contact openings are well known in the art and, thus, the techniques are omitted from this specification in order to allow the reader to focus on the salient aspects of the disclosed methods. As illustrated and discussed above, a single gate opening 273 can, optionally, expose vertical surfaces of two adjacent gates 215, 225 and, thus, a single self-aligned gate contact 283 can contact adjacent gates 215, 225.

Referring to FIGS. 14A-14B and 26A-26B, disclosed herein are embodiments of a semiconductor structure 200 and 200' formed according to the above-describe method embodiments of FIGS. 1 and 15, respectively.

The semiconductor structure 200, 200' can include a semiconductor substrate 201. The semiconductor substrate 201 can be a bulk semiconductor substrate (e.g., a bulk silicon substrate), as illustrated. Alternatively, the semiconductor substrate 201 can be a semiconductor layer of a semiconductor-on-insulator structure (e.g., a silicon layer of a silicon-on-insulator (SOI) structure).

The semiconductor structure 200, 200' can include at least one vertical field effect transistor (VFET) on the semiconductor substrate 201. For purposes of illustration, the semiconductor structure 200, 200' is described in detail below and illustrated in the figures as including two P-type VFETs 210 within a P-type VFET region and two N-type VFETs 220 within an N-type VFET region that is adjacent to the P-type VFET region.

Each VFET 210, 220 can have a first end 291, a second end 292 opposite the first end 291, and opposing sides 293.

Each P-type VFET 210 can include a semiconductor fin 211, which functions as the channel region. This semiconductor fin 211 can be undoped or, alternatively, can be doped so as to have N-type conductivity at a relatively low conductivity level (e.g., an N-semiconductor fin). The semiconductor fin 211 can extend vertically between a lower source/drain region 212 within the semiconductor substrate 201 and an upper source/drain region 213. The lower source/drain region 212 and the upper source/drain region can each be doped so as to have P-type conductivity at a relatively high conductivity level (e.g., P+ source/drain regions). The lower source/drain region 212 can be a dopant implant region or, alternatively, an epitaxial semiconductor-filled trench. The upper source/drain region 213 can be an epitaxial semiconductor region deposited on the upper portion of the semiconductor fin 211. Each P-type VFET 210 can further have a cap layer 245 on the top surface of the upper source/drain region 213, a spacer layer 202 on the lower source/drain region 212 and laterally surrounding a lower portion of the semiconductor fin 211, a gate 215 (including a gate dielectric layer and a gate conductor layer on the gate dielectric layer) above the spacer layer 202 and laterally surrounding a middle portion of the semiconductor fin 211, and a source/drain sidewall spacer 244 on the top surface of the gate 215 and laterally surrounding the upper source/drain region 213 and the cap layer 245.

Each N-type VFET 220 can include a semiconductor fin 221, which functions as the channel region. This semiconductor fin 221 can be undoped or, alternatively, can be doped so as to have P-type conductivity at a relatively low conductivity level (e.g., an P- semiconductor fin). The semiconductor fin 221 can extend vertically between a lower source/drain region 222 within the semiconductor substrate 201 and an upper source/drain region 223. The lower source/drain region 222 and the upper source/drain region can each be doped so as to have N-type conductivity at a relatively high conductivity level (e.g., N+ source/drain regions). The lower source/drain region 222 can be a dopant implant region or, alternatively, an epitaxial semiconductor-filled trench. The upper source/drain region 223 can be an epitaxial semiconductor region deposited on the upper portion of the semiconductor fin 221. Each N-type VFET 220 can further have a cap layer 245 on the top surface of the upper source/drain region 213, a spacer layer 202 on the lower source/drain region 222 and laterally surrounding a lower portion of the semiconductor fin 221, a gate 225 (including a gate dielectric layer and a gate conductor layer on the gate dielectric layer) above the spacer layer 202 and laterally surrounding a middle portion of the semiconductor fin 221, and a source/drain sidewall spacer 244 on the top surface of the gate 225 and laterally surrounding the upper source/drain region 223 and the cap layer 245.

As illustrated, the semiconductor fins 211 of the P-type VFETs 210 can be essentially parallel. The semiconductor fins 221 of the N-type VFETs 220 can also be essentially parallel and in end-to-end alignment with adjacent semiconductor fins 211 in the first-type VFET region. Optionally, as illustrated in the semiconductor structure 200' of FIGS. 26A-26B, each VFET 210, 220 can further include a gate sidewall spacer 248 above the spacer layer 202 and positioned laterally immediately adjacent to side surfaces of the gate and the spacer thereon at the first end 291 of the VFET. It should be noted that, in this case, an outer portion of the lower source/drain region of the VFET will extend laterally beyond the gate sidewall spacer to allow the lower source/drain region to be contacted.

The semiconductor structure 200, 200' can further include multiple isolation regions (e.g., isolation regions 235 and additional isolation regions 236). Specifically, the isolation regions 235 can have lower portions, which are within the semiconductor substrate 201 and electrically isolate adjacent lower source/drain regions 212, 222. These isolation regions 235 can further extend upward through the spacer layer 202 and be positioned laterally immediately adjacent to the gates 215, 225 of each VFET at the opposing sides 293 and the second ends 292. The additional isolation regions 236 can be on the spacer layer 202 and further positioned laterally adjacent to the first ends 291 of the VFETs 210, 220. For example, in the semiconductor structure 200 of FIGS. 14A-14B, the additional isolation regions 236 can be on the spacer layer 202 and positioned laterally immediately adjacent to the gates 215, 225 at the first ends 291 of the VFETs 210, 220. Alternatively, in the semiconductor structure 200' of FIGS. 26A-26B, the additional isolation regions 236 can be on the spacer layer 202 such that the gate sidewall spacers 244 are positioned laterally adjacent to and between the gates 215, 225 and the additional isolation regions at the first ends 291 of the VFETs 210, 220.

The isolation regions 235-236 can be made of a first dielectric material (e.g., silicon dioxide). The spacer layer 202 can be made of the same first dielectric material (e.g., silicon dioxide). Alternatively, the spacer layer 202 can be made of a different dielectric material. For example, the spacer layer 202 can be made of a low-K dielectric material (i.e., a dielectric material having a dielectric constant below that of silicon dioxide and, particularly, below 3.9, such as carbon-doped silicon dioxide, porous silicon dioxide, etc.). The source/drain sidewall spacers 244, the cap layers 245 and the optional gate sidewall spacers 248 can each be made of a second dielectric material (e.g., silicon nitride). Alternatively, any one or more of these components (i.e., the source/drain sidewall spacers 244, the cap layers 245 and the optional gate sidewall spacers 248) can be made of any other suitable dielectric material that is different from the first dielectric material.

The semiconductor structure can further include a dielectric layer 246 on the top surfaces of the additional isolation regions 236 at the first ends 291 of the VFETs 210, 220, the cap layers 244 on the VFETs 210, 220 and further on the isolation regions 235 at the opposing sides 293 and second ends 292 of the VFETs 210, 220. The dielectric layer 246 can be made of the same first dielectric material (e.g., silicon dioxide).

The semiconductor structure 200, 200' can further include contacts to the various VFET terminals of the VFETs 210, 220.

These contacts can include upper source/drain contacts 282, which extend essentially vertically through the dielectric layer 246 and through the cap layers 245 to the upper source/drain regions 213, 223.

These contacts can further include self-aligned gate contact 283. These gate contacts 283 can be positioned at the second ends 292 of the VFET 210, 220. They can extend vertically through the dielectric layer 246 and into the isolation region 235, can be immediately adjacent to vertical surfaces of the gates 215, 225 and can have bottoms that are above the level of the top surface of the spacer layer 202. As illustrated, a single gate opening 283 can, optionally, be shared and, particularly, can contact the vertical surfaces of two adjacent gates 215, 225. As discussed above with regard to the method embodiments, the gate contacts 283 in the disclosed semiconductor structure 200, 200' are "self-aligned" because, during processing, the anisotropic etch process that is used to form the gate contact openings is selective for the first dielectric material (e.g., silicon dioxide) of the dielectric layer 246 and the isolation region 235 over the different dielectric material (e.g., silicon nitride) of the cap layers 245 and the source/drain sidewall spacers 244. Thus, the upper source/drain regions 213, 223 are protected from exposure during gate contact opening formation and the risks of shorts between the gate contacts 283 and the upper source/drain regions 213, 223 is thereby minimized.

Figure 14A:
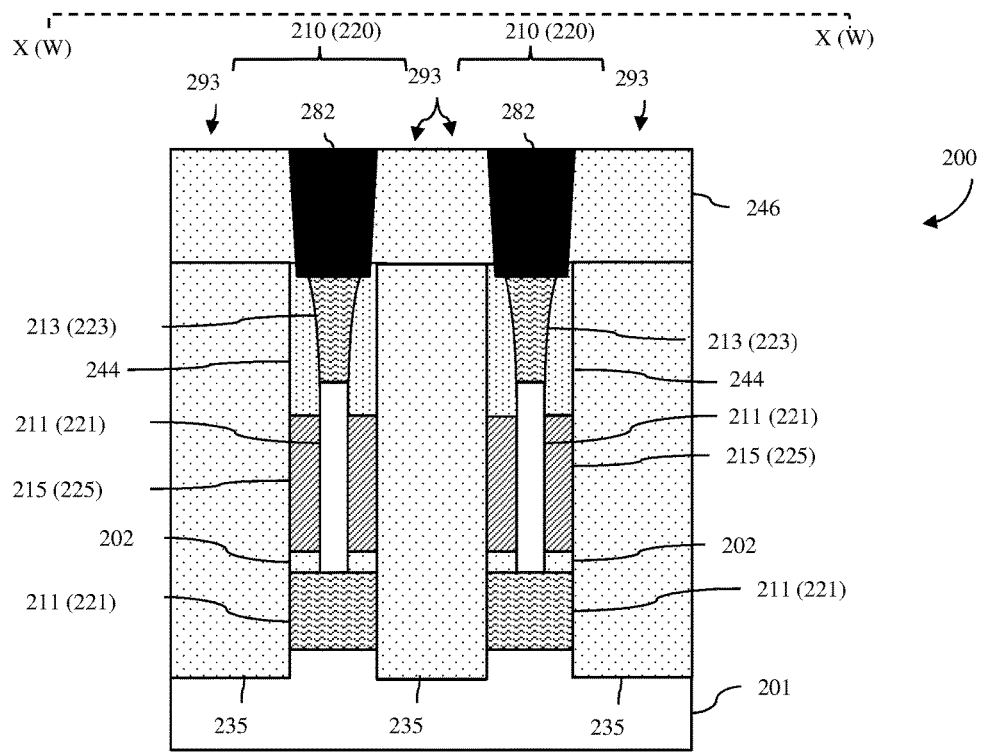
FIGS. 14A and 14B are different cross section diagrams of a structure formed according to the flow diagram of FIG. 1.
Figure 14B:
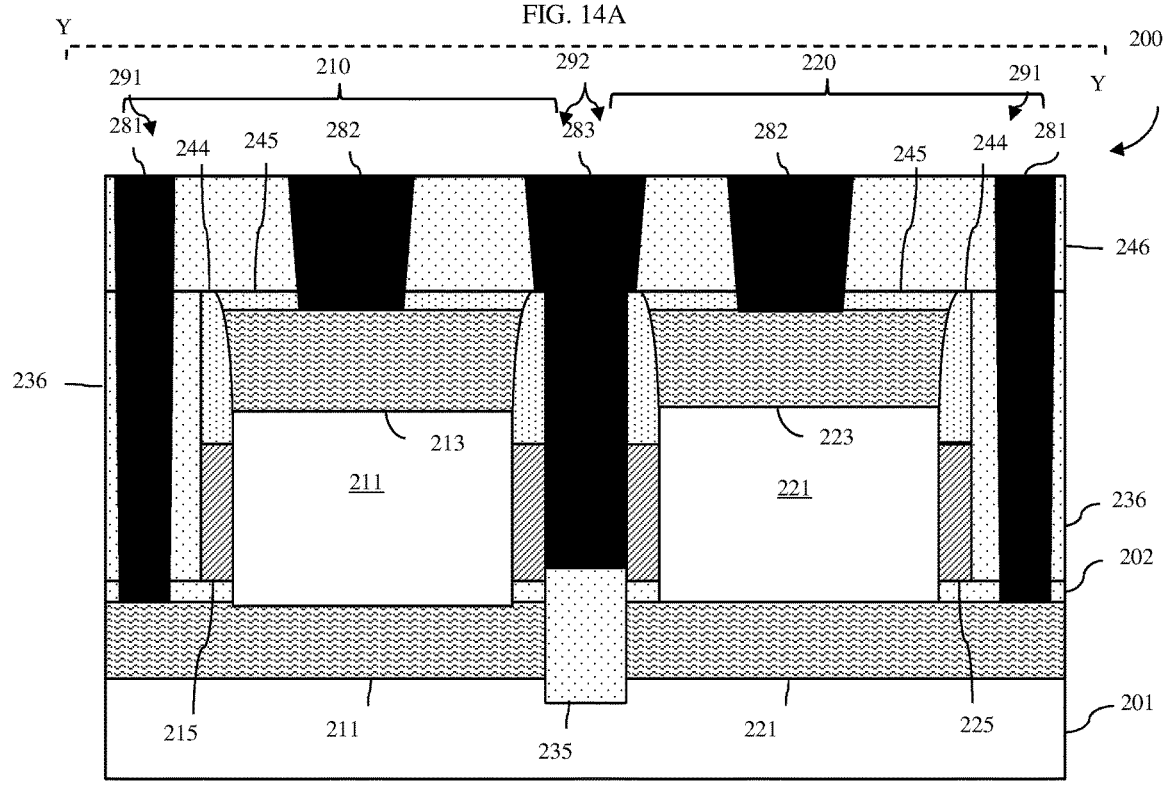

These contacts can also include a conventional lower source/drain contact 281, as shown in the semiconductor structure 200 of FIGS. 14A-14B or a self-aligned lower source/drain contact 281', as shown in the semiconductor structure 200' of FIGS. 26A-26B.

Specifically, the lower source/drain contacts 281 in the semiconductor structure 200 or 281' in the semiconductor structure 200' can be positioned laterally adjacent to the first ends 291 of the VFETs 210, 220. They can extend essentially vertically through the dielectric layer 246, through the additional isolation regions 236, and through the spacer layer 202 down to outer edge portions of lower source/drain regions 212, 222. In the semiconductor structure 200, each lower source/drain contact 281 is physically separated and electrically isolated from the adjacent gate 215, 225 by a portion of the additional isolation region 236. In the semiconductor structure 200', each lower source/drain contact 281 is physically separated and electrically isolated from the adjacent gate 215, 225 by a gate sidewall spacer 248. More particularly, as discussed above with regard to the method embodiment shown in the flow diagram of FIG. 15, the lower source/drain contacts 281' in the disclosed semiconductor structure 200' are "self-aligned" because, during processing, the anisotropic etch process that is used to form the lower source/drain contact openings is selective for the first dielectric material (e.g., silicon dioxide) of the dielectric layer 246 and the isolation region 235 over the different dielectric material (e.g., silicon nitride) of the cap layers 245, the source/drain sidewall spacers 244 and the gate sidewall spacers 248. Thus, the gates 215, 225 are protected from exposure during lower source/drain contact opening formation and the risks of shorts between the lower source/drain contacts 281' and the gates 215, 225 is thereby minimized.

In the above-described methods and structure, the substrate contemplated within the scope of the illustrative embodiments can be formed using any suitable substrate material, such as, for example, monocrystalline Si, SiGe, SiC, III-V compound semiconductor, II-VI compound semiconductor, or SOI. In some embodiments of the invention, the substrate includes a buried oxide layer. Fins are semiconductor structures that are formed using the same material or different materials from the substrate. Vertical fin formation: fins can be formed by any suitable patterning techniques, including but not limited to, lithography followed by etching. Other suitable techniques, such as sidewall image transfer (SIT), self-aligned double patterning (SADP), self-aligned multiple patterning (SAMP), self-aligned quadruple patterning (SAQP) can be used. Source and drains are formed on top and bottom sides of the gates, offset from the gates by the top and bottom gate spacers. According to an exemplary embodiment, source and drains are formed from an in-situ doped (i.e., during growth) epitaxial material such as in-situ doped epitaxial Si, carbon doped silicon (Si:C) and/or SiGe. Suitable n-type dopants include but are not limited to group V dopant, such as arsenic (As), phosphorous (P) or antimony (Sb), and suitable p-type dopants include but are not limited to group III dopant, such as boron (B) or indium (In)). Alternatively, a gallium nitride (GaN)-based semiconductor material having p-type conductivity is typically doped with magnesium (Mg), whereas a gallium nitride (GaN)-based semiconductor material having an n-type conductivity is typically doped with silicon (Si). The use of an in-situ doping process is merely an example. For instance, one may instead employ an ex-situ process to introduce dopants into the source and drains. Other doping techniques include but are not limited to, ion implantation after the bottom source/drain are formed. Dopant techniques include but are not limited to, ion implantation, gas phase doping, plasma doping, plasma immersion ion implantation, cluster doping, infusion doping, liquid phase doping, solid phase doping, in-situ epitaxy growth, or any suitable combination of those techniques. Spacer material: SiN, SiC, SiOC, SiCN, BN, SiBN, SiBCN, SiOCN, SiON, and combinations thereof. The dielectric material can be a low-k material having a dielectric constant less than about 7, less than about 5. Spacers can be formed by any suitable techniques such as deposition followed by directional etch. Deposition may include but is not limited to, atomic layer deposition (ALD), chemical vapor deposition (CVD). Directional etch may include but is not limited to, reactive ion etch (RIE). Contacts: The metal contact fill can be tungsten (W), aluminum (Al), or copper (Cu), cobalt (Co), which can further include a barrier layer. The barrier layer can be titanium nitride (TiN), tantalum nitride (TaN), hafnium nitride (HfN), niobium nitride (NbN), tungsten nitride (WN), or combinations thereof, where the barrier layer can prevent diffusion and/or alloying of the metal contact fill material with the top and bottom source drain material, and/or anode/cathode material. In various embodiments, the barrier layer can be conformally deposited in the trench(es) by ALD, CVD, MOCVD, PECVD, or combinations thereof. In various embodiments, the metal fill can be formed by ALD, CVD, and/or PVD to form the electrical contacts.

Additionally, in the above-described methods and structures, the gate dielectric can comprise any suitable dielectric material, including but not limited to silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum, magnesium. The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. In some embodiments, the gate dielectric has a thickness ranging from 1 nm to 5 nm, although less thickness and greater thickness are also conceived. Gate conductor can comprise any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO2), cobalt silicide (CoSi), nickel silicide (NiSi)), transition metal aluminides (e.g. Ti3Al, ZrAl), TaC, TaMgC, carbon nanotube, conductive carbon, graphene, or any suitable combination of these materials. The conductive material may further comprise dopants that are incorporated during or after deposition. In some embodiments, the gate may further comprise a workfunction setting layer between the gate dielectric and gate conductor. The workfunction setting layer can be a workfunction metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
forming a transistor, an isolation region, and an additional isolation region, wherein the transistor has a first end and a second end opposite the first end and comprises: a semiconductor fin that extends vertically between a lower source/drain region in a substrate and an upper source/drain region and horizontally from adjacent the first end of the transistor to adjacent the second end of the transistor; a spacer layer on the lower source/drain region around the semiconductor fin; a gate on the spacer layer around the semiconductor fin; and a source/drain sidewall spacer on the gate around the upper source/drain region and a cap layer on the upper source/drain region, wherein the isolation region extends from within the substrate through the spacer layer and is positioned laterally adjacent to the second end of the transistor, and wherein the additional isolation region is on the spacer layer and positioned laterally adjacent to the first end of the transistor;
forming a dielectric layer on the transistor, the isolation region and the additional isolation region; and
forming a gate contact that extends vertically through the dielectric layer and into the isolation region, the gate contact being positioned laterally immediately adjacent to the gate at the second end of the transistor and having a bottom above a level of the spacer layer.

2. The method of claim 1, wherein the dielectric layer, the isolation region and the additional isolation region comprise a first dielectric material, and wherein the source/drain sidewall spacer comprises a second dielectric material that is different from the first dielectric material.

3. The method of claim 2, wherein the cap layer comprises an additional dielectric material that is different from the first dielectric material.

4. The method of claim 1, wherein the forming, on the substrate, of the transistor, the isolation region and the additional isolation region comprises:
forming the semiconductor fin with a sacrificial fin cap;
forming the lower source/drain region in the substrate below the semiconductor fin and the spacer layer on the lower source/drain region and laterally surrounding a lower portion of the semiconductor fin;
forming a gate stack on the spacer layer and laterally surrounding the semiconductor fin;
etching back the gate stack so that an upper portion of the sacrificial fin cap extends vertically above the gate stack;
forming a sacrificial sidewall spacer on the gate stack and positioned laterally adjacent to the sacrificial fin cap;
performing an anisotropic etch process to form the gate;
forming a mask on the spacer layer and positioned laterally immediately adjacent to the gate and the source/drain sidewall spacer at the first end of the transistor;
performing an etch process to etch a trench into the substrate at the second end of the transistor and further on opposing sides of the transistor;
selectively removing the mask to expose a portion of the spacer layer at the second end of the transistor;
depositing a first dielectric material into the trench to form the isolation region and onto the exposed portion of the spacer layer at the second end of the transistor to form the additional isolation region;
planarizing the first dielectric material to expose the sacrificial fin cap and the sacrificial sidewall spacer;
selectively removing the sacrificial fin cap and the sacrificial sidewall spacer;
etching back the gate to below a level of a top surface of the semiconductor fin; and
forming the source/drain sidewall spacer on the gate, the upper source/drain region on the top surface of the semiconductor fin, and the cap layer on the upper source/drain region.

5. The method of claim 4, wherein the forming of the gate stack comprises:
depositing a conformal gate dielectric layer; and
depositing a blanket gate conductor layer on the conformal gate dielectric layer.

6. The method of claim 4,
wherein the forming of the gate stack comprises:
depositing a conformal gate dielectric layer;
depositing a conformal gate conductor layer on the conformal gate dielectric layer; and
depositing a fill material on the conformal gate conductor layer, and
wherein, after the forming of the gate stack and during the forming of the sacrificial sidewall spacer, the sacrificial sidewall spacer is formed so that a width of the sacrificial sidewall spacer is less than or equal to a thickness of the conformal gate conductor layer so that, when the anisotropic etch process is performed to form the gate, the fill material is substantially removed.

7. The method of claim 1, further comprising forming a lower source/drain contact and forming an upper source/drain contact.

8. A method comprising:
forming, on a substrate, a vertical field effect transistor, an isolation region, and an additional isolation region,
wherein the vertical field effect transistor has a first end, a second end opposite the first end, and opposing sides and comprises: a semiconductor fin that extends vertically between a lower source/drain region in the substrate and an upper source/drain region and that extends horizontally from adjacent the first end of the vertical field effect transistor to adjacent the second end of the vertical field effect transistor; a cap layer on the upper source/drain region; a spacer layer on the lower source/drain region and laterally surrounding the semiconductor fin; a gate on the spacer layer and laterally surrounding the semiconductor fin; a source/drain sidewall spacer on the gate and laterally surrounding the upper source/drain region and the cap layer; and a gate sidewall spacer on the spacer layer and positioned laterally adjacent to the gate and the source/drain sidewall spacer at the first end of the vertical field effect transistor,
wherein an outer edge portion of the lower source/drain region extends laterally beyond the gate sidewall spacer at the first end of the vertical field effect transistor,
wherein the isolation region extends from within the substrate up through the spacer layer and is positioned laterally adjacent to the second end and the opposing sides of the vertical field effect transistor, and
wherein the additional isolation region is on the spacer layer and positioned laterally adjacent to the gate at the first end of the vertical field effect transistor;
forming a dielectric layer over the vertical field effect transistor, the isolation region, and the additional isolation region; and
forming a gate contact, a lower source/drain contact, and an upper source/drain contact, wherein the gate contact is adjacent to the second end of the vertical field effect transistor and extends vertically through the dielectric layer and into the isolation region, the gate contact further being positioned laterally immediately adjacent to the gate and having a bottom above a level of the spacer layer, wherein the lower source/drain contact is adjacent to the first end of the vertical field effect transistor, extends through the dielectric layer, the additional isolation region and the spacer layer to the outer edge portion of the lower source/drain region, the lower source/drain contact further being positioned laterally immediately adjacent to the gate sidewall spacer, and wherein the upper source/drain contact extends through the dielectric layer and the cap layer to the upper source/drain region.

9. The method of claim 8, wherein the dielectric layer, the isolation region and additional isolation region comprise a first dielectric material, and wherein the source/drain sidewall spacer comprises a second dielectric material that is different from the first dielectric material.

10. The method of claim 9, wherein the cap layer comprises an additional dielectric material that is different from the first dielectric material.

11. The method of claim 9, wherein the gate sidewall spacer comprises any one of the second dielectric material and an additional dielectric material that is different from the first dielectric material.

12. The method of claim 8, wherein the dielectric layer, the isolation region and the additional isolation region comprise silicon dioxide and wherein the source/drain sidewall spacer, the cap layer and the gate sidewall spacer comprise silicon nitride.

13. The method of claim 8,
wherein the forming, on the substrate, of the vertical field effect transistor, the isolation region, and the additional isolation region comprises:
    forming the semiconductor fin with a sacrificial fin cap;
    forming the lower source/drain region in the substrate below the semiconductor fin and the spacer layer on the lower source/drain region and laterally surrounding a lower end of the semiconductor fin;
    forming a gate stack on the spacer layer and laterally surrounding the semiconductor fin;
    etching back the gate stack so that an upper end of the sacrificial fin cap extends vertically above the gate stack;
    forming a sacrificial sidewall spacer on the gate stack and positioned laterally adjacent to the sacrificial fin cap;
    performing an anisotropic etch process to form the gate;
    forming a mask on the spacer layer and positioned laterally immediately adjacent to the gate and the source/drain sidewall spacer at the first end of the vertical field effect transistor;
    performing an etch process to etch a trench into the substrate at the second end and the opposing sides of the vertical field effect transistor;
    depositing a first dielectric material into the trench to form the isolation region;
    planarizing the first dielectric material to expose the sacrificial fin cap and the sacrificial sidewall spacer;
    selectively removing the mask to expose a portion of the spacer layer at the first end of the vertical field effect transistor;
    forming the gate sidewall spacer immediately adjacent to the gate at the first end of the vertical field effect transistor;
    redepositing the first dielectric material to form the additional isolation region on the spacer layer and positioned laterally immediately adjacent to the gate sidewall spacer at the second end of the vertical field effect transistor;
    planarizing the first dielectric material to expose the sacrificial fin cap and the sacrificial sidewall spacer;
    selectively removing the sacrificial fin cap and the sacrificial sidewall spacer;
    etching back the gate to below a top surface of the semiconductor fin; and
    forming the source/drain sidewall spacer on the gate, the upper source/drain region on the top surface of the semiconductor fin and the cap layer on the upper source/drain region.

14. The method of claim 13, wherein the forming of the gate stack comprises:
    depositing a conformal gate dielectric layer; and
    depositing a blanket gate conductor layer on the conformal gate dielectric layer.

15. The method of claim 13,
wherein the forming of the gate stack comprises:
    depositing a conformal gate dielectric layer;
    depositing a conformal gate conductor layer on the conformal gate dielectric layer; and
    depositing a fill material on the conformal gate conductor layer, and
wherein, after the forming of the gate stack and during the forming of the sacrificial sidewall spacer, the sacrificial sidewall spacer is formed so that a width of the sacrificial sidewall spacer is less than or equal to a thickness of the conformal gate conductor layer so that, when the anisotropic etch process is performed to form the gate, the fill material is substantially removed.

16. A semiconductor structure comprising:
a vertical field effect transistor on a substrate,
    wherein the vertical field effect transistor has a first end, a second end opposite the first end, and opposing sides,
    wherein the vertical field effect transistor comprises: a semiconductor fin that extends vertically between a lower source/drain region in the substrate and an upper source/drain region and that extends horizontally from adjacent the first end of the vertical field effect transistor to adjacent the second end of the vertical field effect transistor; a cap layer on the upper source/drain region; a spacer layer on the lower source/drain region and laterally surrounding the semiconductor fin; a gate on the spacer layer and laterally surrounding the semiconductor fin; and a source/drain sidewall spacer on the gate and laterally surrounding the upper source/drain region and the cap layer, and
    wherein an outer edge portion of the lower source/drain region extends laterally beyond the gate at the first end of the vertical field effect transistor;
an isolation region extending from within the substrate up through the spacer layer and positioned laterally adjacent the second end and the opposing sides of the vertical field effect transistor;
an additional isolation region on the spacer layer and positioned laterally adjacent to the first end of the vertical field effect transistor;

a dielectric layer on the vertical field effect transistor and further extending over the additional isolation region and the isolation region; and a gate contact that extends through the dielectric layer and into the isolation region, the gate contact being positioned laterally immediately adjacent to the gate at the second end of the vertical field effect transistor and having a bottom above a level of the spacer layer.

17. The semiconductor structure of claim 16, wherein the dielectric layer, the isolation region and the additional isolation region comprise a first dielectric material, and wherein the source/drain sidewall spacer comprises a second dielectric material that is different from the first dielectric material.

18. The semiconductor structure claim 17, wherein the cap layer comprises an additional dielectric material that is different from the first dielectric material.

19. The semiconductor structure of claim 16, further comprising: a lower source/drain contact adjacent to the first end and extending through the dielectric layer, the additional isolation region and the spacer layer to the outer edge portion of the lower source/drain region.

20. The semiconductor structure of claim 19, wherein the vertical field effect transistor further comprises a gate sidewall spacer on the spacer layer adjacent to the first end of the vertical field effect transistor and positioned laterally immediately adjacent to and between the gate and the additional isolation region, wherein the outer edge portion of the lower source/drain region extends laterally beyond the gate sidewall spacer, wherein the lower source/drain contact is further positioned laterally immediately adjacent to the the gate sidewall spacer, wherein the dielectric layer, the isolation region and the additional isolation region comprise a first dielectric material, wherein the source/drain sidewall spacer comprises a second dielectric material that is different from the first dielectric material, and wherein the cap layer and the gate sidewall spacer each comprise any one of the second dielectric material and an additional dielectric material that is different from the first dielectric material.

* * * * *